(12) United States Patent
Misra et al.

(10) Patent No.: US 11,035,227 B2
(45) Date of Patent: Jun. 15, 2021

(54) GENERATING SPECTRAL RESPONSES OF MATERIALS

(71) Applicant: The Board of Regents of the University of Oklahoma, Norman, OK (US)

(72) Inventors: Siddharth Misra, Norman, OK (US); Hao Li, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 256 days.

(21) Appl. No.: 16/035,450

(22) Filed: Jul. 13, 2018

(65) Prior Publication Data

US 2019/0017374 A1    Jan. 17, 2019

Related U.S. Application Data

(60) Provisional application No. 62/532,803, filed on Jul. 14, 2017, provisional application No. 62/554,352, (Continued)

(51) Int. Cl.
*E21B 49/00* (2006.01)
*G01N 24/08* (2006.01)
(Continued)

(52) U.S. Cl.
CPC ........... *E21B 49/00* (2013.01); *G01N 24/081* (2013.01); *G01R 33/448* (2013.01); *G01V 3/14* (2013.01);
(Continued)

(58) Field of Classification Search
CPC ...................................................... E21B 49/00
See application file for complete search history.

(56) References Cited

U.S. PATENT DOCUMENTS

| 2009/0248309 | A1* | 10/2009 | Neville ............... G01V 5/04 702/8 |
| 2017/0200265 | A1 | 7/2017 | Bhaskar et al. |
| 2017/0206464 | A1 | 7/2017 | Clayton et al. |

FOREIGN PATENT DOCUMENTS

WO    2017094899 A1    6/2017

OTHER PUBLICATIONS

Doersch, Carl; "Tutorial on Variational Autoencoders"; Carnegie Mellon / UC Berkeley; arXiv:1606.05908v2; Aug. 16, 2016; 23 pages.

(Continued)

*Primary Examiner* — John E Breene
*Assistant Examiner* — Jeffrey C Morgan
(74) *Attorney, Agent, or Firm* — Conley Rose, P.C.

(57) ABSTRACT

In one non-limiting embodiment, the present disclosure is directed to a controller having a memory; and a processor coupled to the memory and configured to: cause a neural network to receive current measurements of a current material; instruct the neural network to determine dominant features of the current measurements; instruct the neural network to provide the dominant features to a decoder; and instruct the decoder to generate a generated spectral response of the current material based on the dominant features. In another non-limiting embodiment, the present disclosure is directed to a method including the steps of receiving current measurements of a current material; determining dominant features of the current measurements; providing the dominant features; and generating a generated spectral response of the current material based on the dominant features.

32 Claims, 15 Drawing Sheets

Related U.S. Application Data filed on Sep. 5, 2017, provisional application No. 62/598,182, filed on Dec. 13, 2017.

(51) Int. Cl.
  *G01V 3/32* (2006.01)
  *G06N 3/08* (2006.01)
  *G01R 33/44* (2006.01)
  *G01V 3/14* (2006.01)
  *G06N 3/04* (2006.01)

(52) U.S. Cl.
  CPC ............. *G01V 3/32* (2013.01); *G06N 3/0445* (2013.01); *G06N 3/0454* (2013.01); *G06N 3/0472* (2013.01); *G06N 3/08* (2013.01); *G06N 3/084* (2013.01)

(56) References Cited

OTHER PUBLICATIONS

Elkatatny, S.M., et al.; "Application of Artificial Intelligent Techniques to Determine Sonic Time from Well Logs"; American Rock Mechanics Association; ARMA 16-755; Jun. 2016; 11 pages.

Farzi, Reza, et al.; "Simulation of NMR Response from Micro-CT Images Using Artificial Neural Networks"; Journal of Natural Gas Science and Engineering; vol. 39; Mar. 2017; 8 pages.

Goodfellow, Ian, et al.; "Deep Learning—Chapter 14: Autoencoders"; Nov. 10, 2016; 25 pages.

Kingma, Diederik P., et al.; "Auto-Encoding Variational Bayes"; arXiv:1312.6114v10; May 1, 2014; 14 pages.

Labani, Mohammad Mahdi, et al.; "Estimation of NMR Log Parameters from Conventional Well Log Data Using a Committee Machine with Intelligent Systems: A Case Study from the Iranian Part of the South Pars Gas Field, Persian Gulf Basin"; Journal of Petroleum Science and Engineering; vol. 72; May 2010; 11 pages.

Simpson, Gary, et al.; "Using Advanced Logging Measurements to Develop a Robust Petrophysical Model for the Bakken Petroleum System"; SPWLA 56th Annual Logging Symposium; Jul. 18-22, 2015; 24 pages.

* cited by examiner

GENERATING SPECTRAL RESPONSES OF MATERIALS

CROSS-REFERENCE TO RELATED APPLICATIONS

This application claims priority to U.S. provisional patent application No. 62/532,803 filed on Jul. 14, 2017 by The Board of Regents of the University of Oklahoma and titled "Generating Spectral Responses of Materials," U.S. provisional patent application No. 62/554,352 filed on Sep. 5, 2017 by The Board of Regents of the University of Oklahoma and titled "Generating Spectral Responses of Materials," and U.S. provisional patent application No. 62/598,182 filed on Dec. 13, 2017 by The Board of Regents of the University of Oklahoma and titled "Generating Spectral Responses of Materials," all of which are incorporated by reference.

STATEMENT REGARDING FEDERALLY SPONSORED RESEARCH OR DEVELOPMENT

Not applicable.

BACKGROUND

Material analyses are important tools in many industries. Material analyses help determine types, characterizations, properties, and positions of those materials, as well as what substances and how much of those substances are in those materials. The properties include spatial features, internal arrangements, compositions, structures, distributions, and temporal changes. It is desirable to conduct material analyses in a cost-effective and operationally-convenient manner in the absence of the infrastructure needed to directly perform those material analyses. As a result, significant research is directed to reducing costs of material analyses, as well as improving materials analyses with an emphasis on reducing operational challenges.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
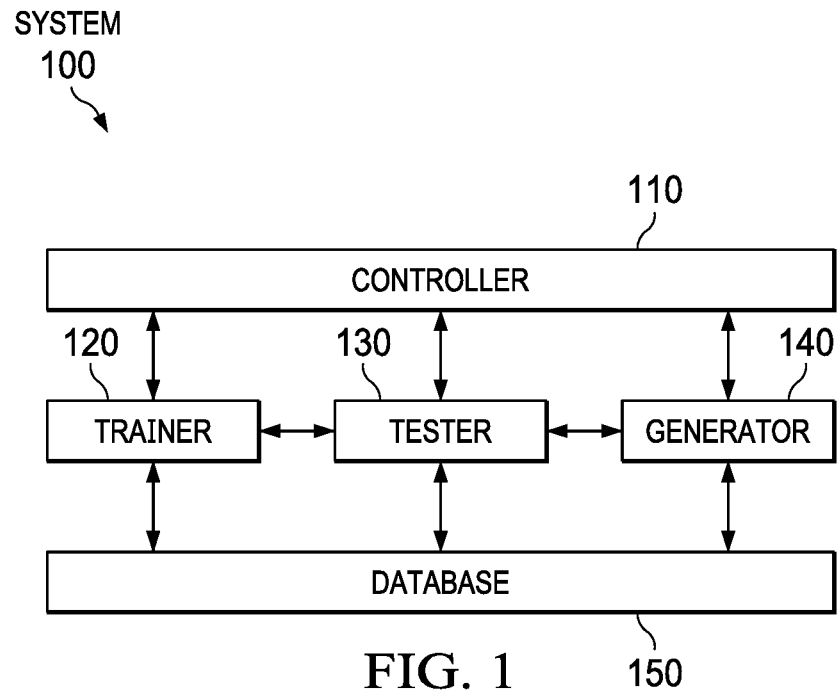
FIG. 1 is a schematic diagram of a system for generating spectral responses of materials.

In at least one non-limiting embodiment, the present disclosure is directed to a controller having a memory, and a processor coupled to the memory and configured to cause a neural network to (1) receive current measurements of a current material, (2) instruct the neural network to determine dominant features of the current measurements, (3) instruct the neural network to provide the dominant features to a decoder, and (4) instruct the decoder to generate a specific spectral response of the current material based on the dominant features.

In another non-limiting embodiment, the disclosure is directed to a method including the steps of (1) receiving current measurements of a current material, (2) determining dominant features of the current measurements, (3) providing the dominant features, and (4) generating a spectral response of the current material based on the dominant features.

In another non-limiting embodiment, the present disclosure is directed to a system having (1) a trainer including a deep neural network model having an encoder, a latent space database coupled to the encoder, and a first decoder; (2) a neural network system having a first neural network, and a second decoder associated with the first decoder; (3) a tester having a second neural network associated with the first neural network; (4) a third decoder associated with the second decoder; (5) a generator having a third neural network associated with the second neural network; and (6) a fourth decoder associated with the third decoder. In non-limiting embodiments, the deep neural network model can be a VAE, a GAN, an LSTM, an RNN, or a CNN for generating the specific spectral response.

The spectral response generated by the controllers, systems, and methods of the present disclosure may be used to instruct an operation such as, but not limited to, a drilling operation and/or a well completion operation.

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified in accordance with the presently disclosed inventive concepts.

Features of any of the embodiments described herein may be combined with any of the other embodiments to create a new embodiment. These and other features will be more clearly understood from the following detailed description taken in conjunction with the accompanying drawings and exemplary claims.

Before describing various embodiments of the present disclosure in more detail by way of exemplary description, examples, and results, it is to be understood as noted above that the present disclosure is not limited in application to the details of methods and apparatus as set forth in the following description. The present disclosure is capable of other embodiments or of being practiced or carried out in various ways. As such, the language used herein is intended to be given the broadest possible scope and meaning; and the embodiments are meant to be exemplary, not exhaustive. Also, it is to be understood that the phraseology and terminology employed herein is for the purpose of description and should not be regarded as limiting unless otherwise indicated as so. Moreover, in the following detailed description, numerous specific details are set forth in order to provide a more thorough understanding of the disclosure. However, it will be apparent to a person having ordinary skill in the art that the embodiments of the present disclosure may be practiced without these specific details. In other instances, features which are well known to persons of ordinary skill in the art have not been described in detail to avoid unnecessary complication of the description.

Unless otherwise defined herein, scientific and technical terms used in connection with the present disclosure shall have the meanings that are commonly understood by those having ordinary skill in the art. Further, unless otherwise required by context, singular terms shall include pluralities and plural terms shall include the singular.

All patents, published patent applications, and non-patent publications mentioned in the specification are indicative of the level of skill of those skilled in the art to which the present disclosure pertains. All patents, published patent applications, and non-patent publications referenced in any portion of this application are herein expressly incorporated by reference in their entirety to the same extent as if each individual patent or publication was specifically and individually indicated to be incorporated by reference.

As utilized in accordance with the methods and apparatus of the present disclosure, the following terms, unless otherwise indicated, shall be understood to have the following meanings:

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or when the alternatives are mutually exclusive, although the disclosure supports a definition that refers to only alternatives and "and/or." The use of the term "at least one" will be understood to include one as well as any quantity more than one, including but not limited to, 2, 3, 4, 5, 6, 7, 8, 9, 10, 15, 20, 30, 40, 50, 100, or any integer inclusive therein. The term "at least one" may extend up to 100 or 1000 or more, depending on the term to which it is attached; in addition, the quantities of 100/1000 are not to be considered limiting, as higher limits may also produce satisfactory results. In addition, the use of the term "at least one of X, Y and Z" will be understood to include X alone, Y alone, and Z alone, as well as any combination of X, Y and Z.

As used herein, all numerical values or ranges include fractions of the values and integers within such ranges and fractions of the integers within such ranges unless the context clearly indicates otherwise. Thus, to illustrate, reference to a numerical range, such as 1-10 includes 1, 2, 3, 4, 5, 6, 7, 8, 9, 10, as well as 1.1, 1.2, 1.3, 1.4, 1.5, etc., and so forth. Reference to a range of 1-50 therefore includes 1, 2, 3, 4, 5, 6, 7, 8, 9, 10, 11, 12, 13, 14, 15, 16, 17, 18, 19, 20, etc., up to and including 50, as well as 1.1, 1.2, 1.3, 1.4, 1.5, etc., 2.1, 2.2, 2.3, 2.4, 2.5, etc., and so forth. Reference to a series of ranges includes ranges which combine the values of the boundaries of different ranges within the series. Thus, to illustrate reference to a series of ranges, for example, of 1-10, 10-20, 20-30, 30-40, 40-50, 50-60, 60-75, 75-100, 100-150, 150-200, 200-250, 250-300, 300-400, 400-500, 500-750, 750-1,000, includes ranges of 1-20, 10-50, 50-100, 100-500, and 500-1,000, for example. A reference to degrees such as 1 to 90 is intended to explicitly include all degrees in the range.

As used herein, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAABCCCC, CBBAAA, CABABB, and so forth. The skilled artisan will understand that typically there is no limit on the number of items or terms in any combination, unless otherwise apparent from the context.

Throughout this application, the term "about" is used to indicate that a value includes the inherent variation of error. Further, in this detailed description, each numerical value (e.g., temperature or time) should be read once as modified by the term "about" (unless already expressly so modified), and then read again as not so modified unless otherwise indicated in context. As noted, any range listed or described herein is intended to include, implicitly or explicitly, any number within the range, particularly all integers, including the end points, and is to be considered as having been so stated. For example, "a range from 1 to 10" is to be read as indicating each possible number, particularly integers, along the continuum between about 1 and about 10. Thus, even if specific data points within the range, or even no data points within the range, are explicitly identified or specifically referred to, it is to be understood that any data points within the range are to be considered to have been specified, and that the inventors possessed knowledge of the entire range and the points within the range. The use of the term "about" may mean a range including ±10% of the subsequent number unless otherwise stated.

As used herein, the term "substantially" means that the subsequently described parameter, event, or circumstance completely occurs or that the subsequently described parameter, event, or circumstance occurs to a great extent or degree. For example, the term "substantially" means that the subsequently described parameter, event, or circumstance occurs at least 90% of the time, or at least 91%, or at least 92%, or at least 93%, or at least 94%, or at least 95%, or at least 96%, or at least 97%, or at least 98%, or at least 99%, of the time, or means that the dimension or measurement is within at least 90%, or at least 91%, or at least 92%, or at least 93%, or at least 94%, or at least 95%, or at least 96%, or at least 97%, or at least 98%, or at least 99%, of the referenced dimension or measurement (e.g., length).

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

The following abbreviations and initialisms apply:
ANN: artificial neural network
ASIC: application-specific integrated circuit
BPS: Bakken petroleum system
CNN: convolutional neural network
CPU: central processing unit
CT: computerized tomography
DSP: digital signal processor
EO: electrical-to-optical
FPGA: field-programmable gate array
ft: foot, feet
GAN: generative adversarial network
GHz: gigahertz
GR: gamma ray
GUI: graphical user interface
KL: Kullback-Leibler
LSTM: long short-term memory
MHz: megahertz
ML: machine learning
ms: millisecond(s)
mS/m: millisiemen(s) per meter
NMR: nuclear magnetic resonance
NN: neural network
OE: optical-to-electrical
RAM: random-access memory
RMS: root mean square
RNN: recurrent neural network
ROM: read-only memory
RX: receiver unit
SRAM: static RAM
TCAM: ternary content-addressable memory
TOC: total organic compound
TX: transmitter unit
VAE: variational auto-encoder
Vp: compressional velocity
Vs: shear velocity
wt %: percentage by weight
1D: one-dimensional
2D: two-dimensional
3D: three-dimensional
%: percentage.

The oil and gas industry is one industry that conducts material analyses of geological materials in laboratories and in the subsurface using wireline logging tools, logging while drilling tools, measurement while drilling tools and rate/pressure transient measurements. For instance, the oil and gas industry performs spectral analyses of porous materials such as shale or other hydrocarbon-bearing rocks that contain water, carbon, or other materials to determine what kind of rock is analyzed, how porous the rock is, how big the pores are, a pore size distribution, a depth below the surface where the rock exhibits a desired property, whether water or oil is in the rock, how much water or oil is in the rock, permeability, fluid mobility, bound fluid saturation, or other characteristics. The civil, mining, geoengineering, chemical, non-destructive testing, remote sensing, material science, analytical chemistry, semiconductor, medical sensing, polymer, and geophysical industries also perform such material analyses. One way to conduct such a material analysis is to perform spectroscopy.

Spectroscopy is a process in which a tool excites a material using radiative energy such as electromagnetic radiation, kinetic energy of particles, acoustic waves, or mechanical impact and an instrument measures a resulting spectral response or emission spectrum. The spectral response is a signal produced due to an interaction between the material and the radiative energy. The instrument measures or decomposes the signal as a function of a continuous variable such as energy in electron spectroscopy, mass-to-charge ratio in mass spectroscopy, frequency in dielectric spectroscopy, relaxation time in NMR spectroscopy, or time in rate/pressure transient measurements.

For instance, NMR spectroscopy is a process in which a magnetic source applies a magnetic field to a material and an instrument measures a resulting spectral response. Specifically, the magnetic source magnetizes hydrogen nuclei, carbon nuclei, or other nuclei that have magnetic poles. After application of the magnetic field, the material undergoes relaxation, which is the return of the nuclei to their original states. As the material does so, the material emits electromagnetic radiation in a specific manner. A device measures the electromagnetic radiation as a spectral response and may determine a T2 distribution from that spectral response. A T2 distribution indicates a relaxation time associated with broadening of a signal produced during the relaxation of the nuclei.

While spectroscopy is a helpful process, the cost of performing spectroscopy at a site of a material, such as a subsurface hydrocarbon reservoir, a groundwater aquifer, or deep mines, through a borehole may be prohibitively high, particularly when the spectroscopy is NMR spectroscopy, dielectric spectroscopy, or elemental spectroscopy. Mohammad Mandi Labani, et al., "Estimation of NMR log parameters from conventional well log data using a committee machine with intelligent systems: A case study from the Iranian part of the South Pars gas field, Persian Gulf Basin," Journal of Petroleum Science and Engineering, Vol. 72, Issues 1-2, May 2010, which is incorporated by reference, describes a model that estimates NMR permeability from conventional logs. The model estimates NMR permeability, but not bound, free fluid, or other key data. Reza Farzi, et al., "Simulation of NMR response from micro-CT images using artificial neural networks," Journal of Natural Gas Science and Engineering, Vol. 39, pages 54-61, March 2017, which is incorporated by reference, describes acquisition of micro-CT images through measurements of core samples, extraction of numerical features from the CT images, and simulation of an NMR relation time using the numerical features. However, the measurements of the core samples and the extraction of the numerical features are complex and applicable only in a laboratory.

Disclosed herein are embodiments for generating spectral responses of materials. The embodiments may be performed in the absence of some spectroscopy tools by processing current measurements acquired using available spectroscopy tools. The embodiments provide for training, testing, and generating steps based on machine learning and computation to produce generated, or synthetic or simulated, spectral responses of materials using historical measurements for purposes of material analyses in the absence of a spectroscopy tool. The generated spectral responses are not measured at a site, but are instead generated using a generator, historical spectral responses, and other historical measurements, thus greatly reducing the costs of analyzing materials. The embodiments dramatically reduce the dependency on spectroscopy tools when these tools are hard to find and deploy due to operational and logistical challenges. The generated spectral responses help determine what kind of materials are analyzed, how porous the materials are, how big the pores are, pore size distributions, a depth below the surface wherein the materials exhibit desired properties, whether water or oil is in the materials, how much water or oil is in the materials, permeabilities, fluid mobilities, bound fluid saturations, internal structures, compositions, concentrations, spatial variations, temporal changes, or other characteristics of the materials. The embodiments apply to generating spectral responses of subsurface geological formations such as shales, sandstones, carbonates, turbidites, and shaly sands for the oil and gas industry, as well as generating spectral responses of other materials for other industries.

A T2 distribution of a material is calculated as follows:

$$\frac{1}{T_2} = \frac{1}{T_{2,bulk}} + \frac{1}{T_{2,surface}} + \frac{1}{T_{2,diffusion}}, \quad (1)$$

where $T_2$ is a T2 distribution of a material, $T_{2,bulk}$ is a bulk fluid relaxation indicating how much fluid is present in the material, $T_{2,surface}$ is a surface relaxation indicating characteristics of a surface of the material, and $T_{2,diffusion}$ is a diffusion relaxation indicating how excited nuclei diffuse within the material. A fluid type, a hydrogen content, and fluid mobility affect the bulk fluid relaxation. Surface relaxation occurs at a fluid-solid interface. A pore shape, pore network characteristics, and mineralogy affect surface relaxation. Diffusion relaxation occurs due to a non-zero gradient of a magnetic field exciting the material. Thus, both fluid saturations and chemical compositions of materials affect T2 distributions. By first determining complex relationships between the fluid saturations and the chemical compositions on one hand and the T2 distributions on the other hand, as well as identifying complex patterns and features in the spectra and measurements, one can then determine T2 distributions when receiving only the fluid saturations and the chemical compositions as input data. Together, the fluid saturations, the chemical compositions, or other characteristics may be referred to as material measurements, historical measurements, current measurements, real-time measurements, or simply measurements.

FIG. 1 is a schematic diagram of a system 100 for generating spectral responses of materials. The system 100 comprises a controller 110, a trainer 120, a tester 130, a generator 140, and a database 150. The controller 110 is a hardware computer server. The controller 110 controls or instructs the trainer 120, the tester 130, and the generator 140, so it may be understood that the controller 110 controls, instructs, or otherwise causes the functions of those components as described below. Alternatively, the trainer 120, the tester 130, or the generator 140 act independently of the controller 110 for any of the functions of those components as described below. The controller 110 may comprise a GUI or another interface in order for a user to instruct the controller 110 as to how to control the trainer 120, the tester 130, and the generator 140. In addition, the user views or otherwise receives data from, or the user supplies data to, the trainer 120, the tester 130, and the generator 140 via the GUI or other interface. The trainer 120, the tester 130, and the generator 140 are described further below. The database 150 is a memory or a portion of a memory. The database 150 stores data and supplies that data to the trainer 120, the tester 130, and the generator 140. Alternatively, the database 150 is separated into a historical database storage coupled to the trainer 120 and the tester 130, a current measurement storage coupled to the generator 140, and a generated spectral response visualization and storage unit coupled to the generator 140.

Figure 2:
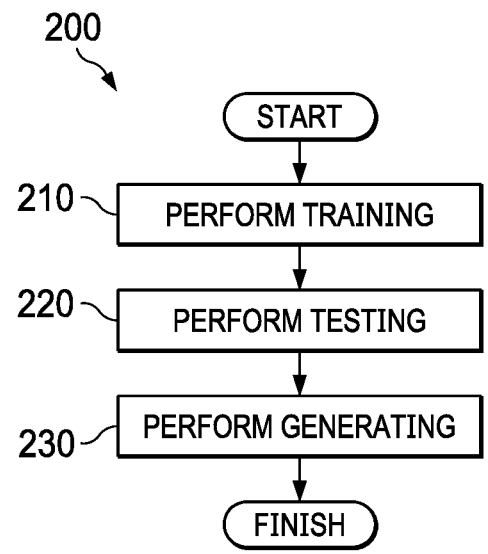
FIG. 2 is a flowchart illustrating a method of generating a spectral response of a material according to an embodiment of the disclosure.

FIG. 2 is a flowchart illustrating a method 200 of generating a spectral response of a material according to an embodiment of the disclosure. The system 100 performs the method 200. At step 210, training is performed. For instance, the trainer 120 performs the training in response to instructions from the controller 110 to create a decoder and a neural network for step 220. The decoder is based on an iterative processing of a historical spectral response of a historical material, and the neural network is based on an iterative processing of historical measurements of the historical material. At step 220, testing is performed. For instance, the tester 130 performs the testing in response to instructions from the controller 110 in order to assess a performance of the decoder and the neural network. The neural network and the decoder are based on a processing of testing measurements of the historical material. Finally, at step 230, generating is performed. For instance, the generator 140 performs the generating in response to instructions from the controller 110 to produce a generated spectral response based on a processing of current measurements of a current material for which no measured spectral response is available, but for which a generated spectral response is desired. The current material is the same material as the historical material or is similar to the historical material. The steps 210, 220, 230 are described further below.

Figure 3:
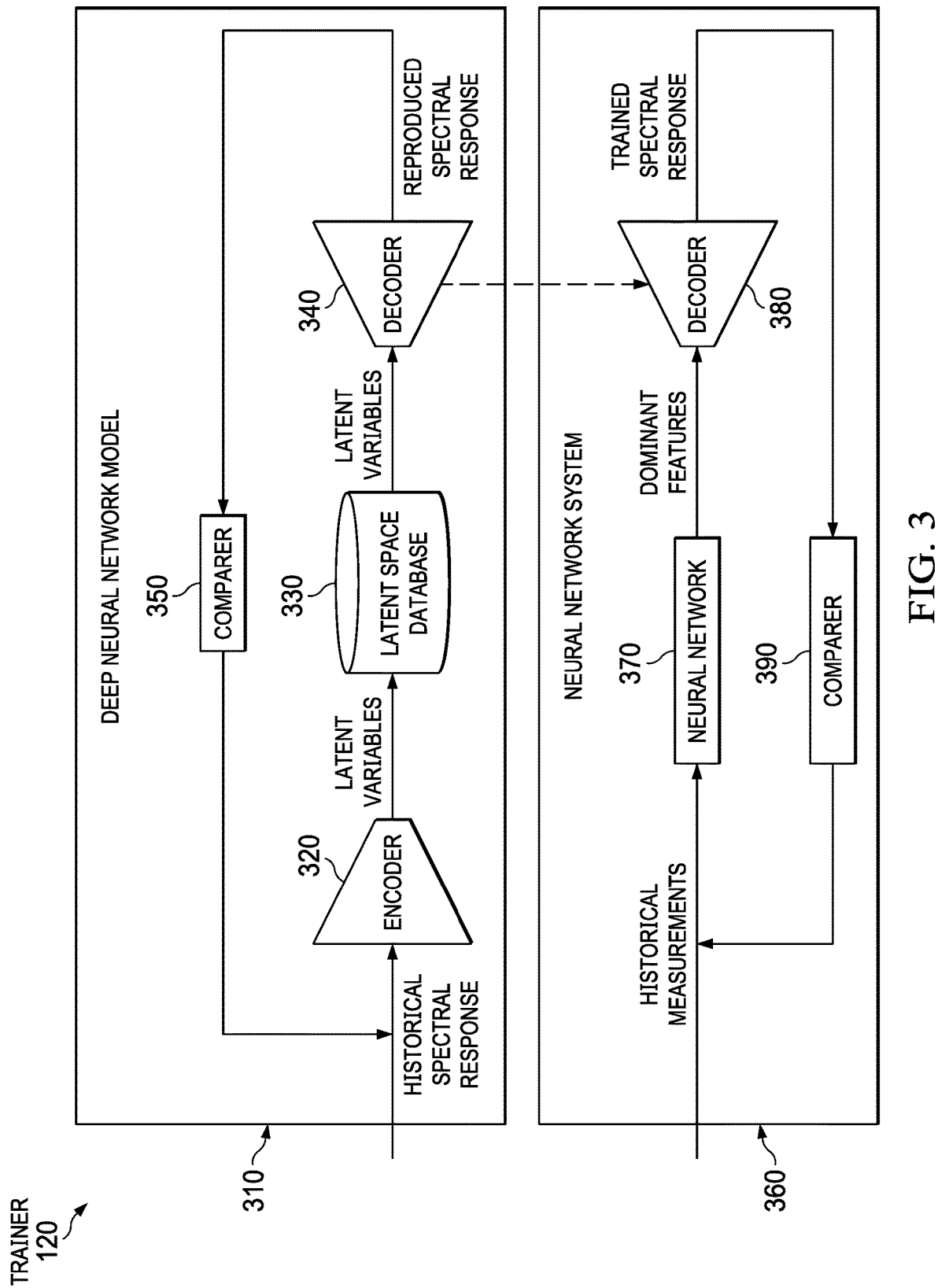
FIG. 3 is a schematic diagram of the trainer in FIG. 1.

FIG. 3 is a schematic diagram of the trainer 120 in FIG. 1. The trainer 120 generally comprises a deep neural network model 310 and a neural network system 360. As mentioned above, the trainer 120 performs step 210 in FIG. 2.

The deep neural network model 310 may be a VAE, an LSTM, a CNN, an RNN, or a GAN. A VAE is a type of auto-encoder. The deep neural network model 310 trains to reproduce its input data as its output data as described in Ian Goodfellow, et al., "Deep Learning," Nov. 10, 2016, which is incorporated by reference. Specifically, the deep neural network model 310 trains to reproduce a historical spectral response as a reproduced spectral response. The deep neural network model 310 comprises an encoder 320, a latent space database 330, a decoder 340, and a comparer 350. The encoder 320, the decoder 340, and the comparer 350 are software components, and the latent space database 330 is a memory or a portion of a memory. The latent space database 330 may be a part of the database 150.

The encoder 320 receives a historical spectral response from the database 150, determines dominant features of the historical spectral response, encodes a latent space based on the dominant features, and provides the latent space to the latent space database 330. Alternatively, the historical spectral response is a real-time spectral response, and the encoder 320 receives the real-time spectral response from a real-time source of data. The historical spectral response is an NMR T2 distribution, an electromagnetic spectrum, a particle concentration/energy spectrum, a natural or induced radiation spectrum such as a gamma-ray spectrum, or another suitable spectral response of the historical material. The historical spectral response originates from a laboratory, subsurface, surface, or atmospheric environment. The dominant features of the historical spectral response may be referred to as latent variables. The dominant features include heights of peaks, variances around the peaks, distances between the peaks, relative features of the peaks, rates of change or other higher-order derivatives of magnitudes and phases with respect to time or other independent variables, numbers of peaks, or other identifying features of the historical spectral response. The word "latent" connotes that the dominant features are not physical features of the historical spectral response with well-defined physical significance. The encoder 320 constrains the latent variables to follow a Gaussian distribution as described in Diederik Kingma, et al., "Auto-Encoding Variational Bayes," May 1, 2014, which is incorporated by reference. The Gaussian distribution adds uncertainty to the latent variables. The latent space is a collection of the latent variables organized in a manner that indicates the latent variables and is therefore usable by the decoder 340. Because the encoder 320 projects data from a relatively higher dimension in the historical spectral response to a relatively lower dimension in the latent space, the encoder 320 narrows from left to right. Alternatively, the encoder acts as a creator or an extractor.

Figure 4:
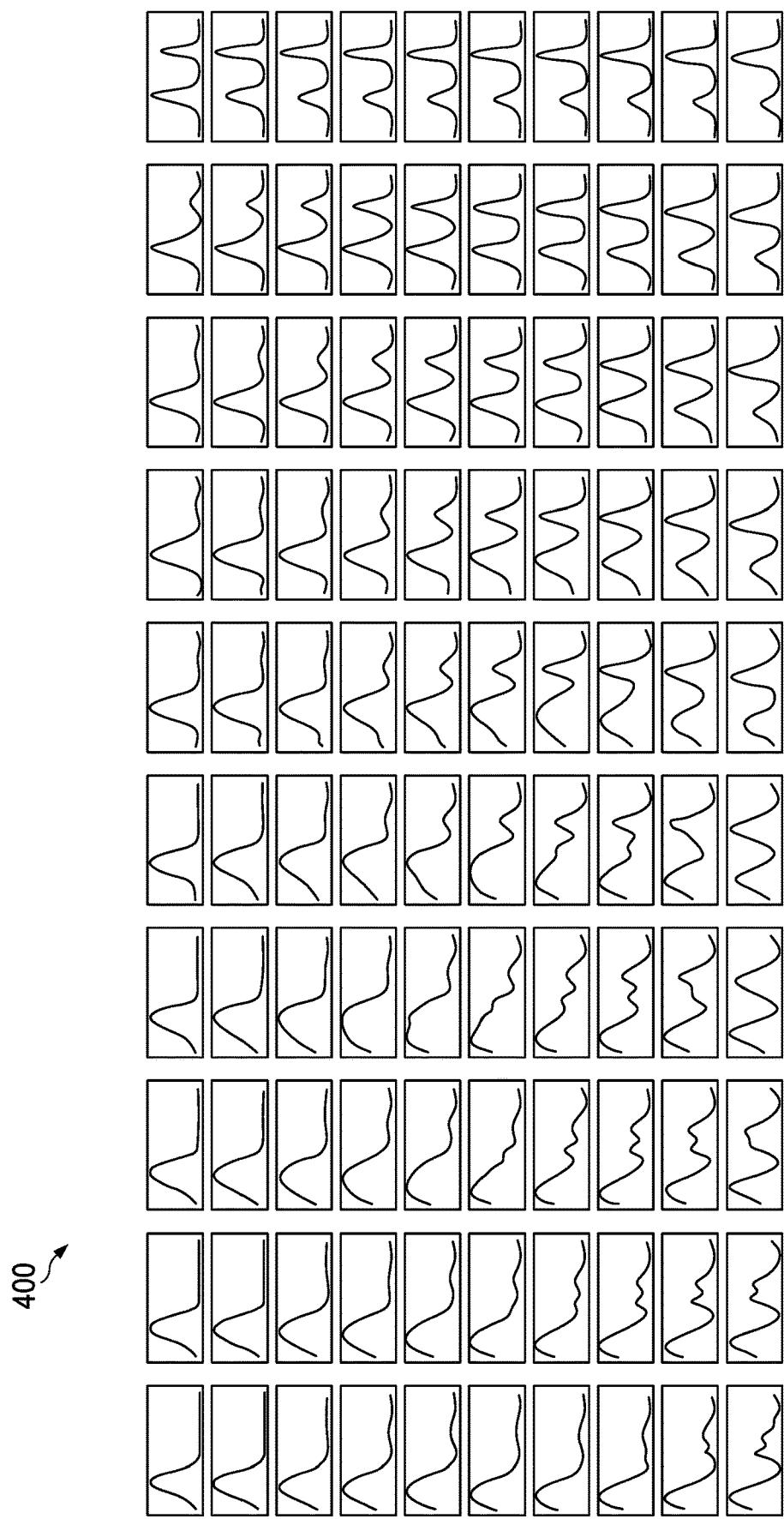
FIG. 4 is a 2D latent space according to an embodiment of the disclosure.
Figure 5:
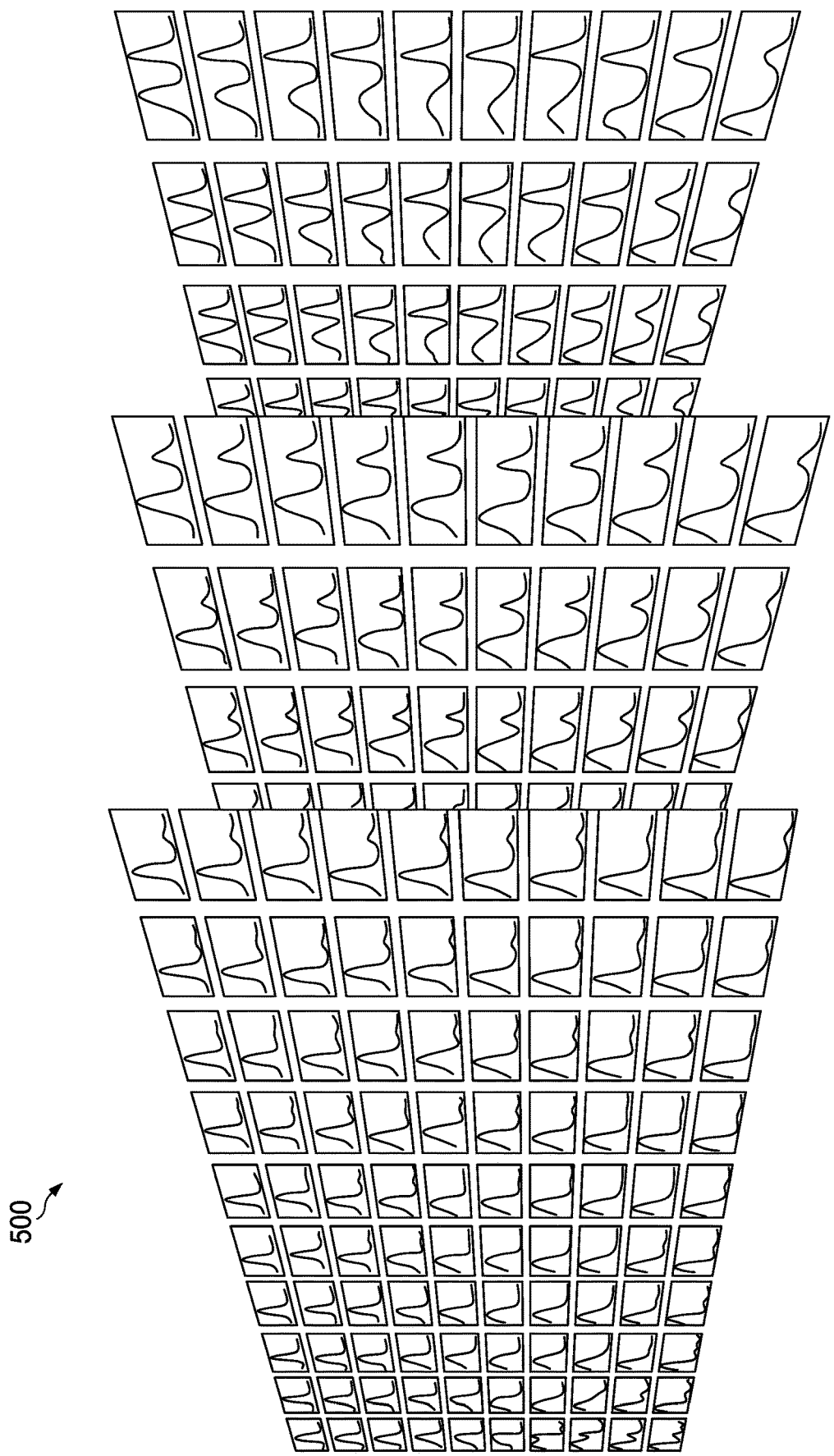
FIG. 5 is a 3D latent space according to an embodiment of the disclosure.

The latent space database 330 receives the latent space from the encoder 320 and stores the latent space. In the latent space, data with similar dominant features are close to each other in order to reduce a loss when the decoder 340 attempts to reproduce the historical spectral response. FIGS. 4 and 5 illustrate such a latent space.

FIG. 4 is a 2D latent space 400 according to an embodiment of the disclosure. The 2D latent space 400 indicates latent variables. As a first example, a top-left corner of the 2D latent space 400 comprises curves with single peaks. As the curves shift to a top-middle portion of the 2D latent space 400, the peaks shift to the middle. As a second example, a top-right corner of the 2D latent space 400 comprises curves with two peaks of similar amplitude. As the curves shift to a bottom-right corner of the 2D latent space 400, left peaks lower in amplitude and right peaks increase in amplitude. The 2D latent space 400 indicates other latent variables as well. These variations are indicative of the learning accomplished during the training the trainer 120 performs at step 210.

FIG. 5 is a 3D latent space 500 according to an embodiment of the disclosure. The 3D latent space 500 is similar to the 2D latent space 400 in FIG. 4, but the 3D latent space 500 provides a third dimension of latent variables in addition to the two dimensions of the 2D latent space 400.

Returning to FIG. 3, the latent space in the latent space database 330 is the 2D latent space 400, the 3D latent space 500, or another suitable latent space. The latent space database 330 may store the 3D latent space 500 or a higher-dimension latent space when there are many historical spectral responses or when those historical responses have a large range of latent variables.

The decoder 340 receives the latent space from the latent space database 330 and decodes a reproduced spectral response based on the encoder's projection of the historical spectral response on the latent space. Because the decoder 340 projects data from a relatively lower dimension in the latent space to a relatively higher dimension in the initial spectral response, the decoder 340 widens from left to right. Alternatively, the decoder 340 acts as a comparator or a reconstructor.

The comparer 350 compares the reproduced spectral response from the decoder 340 to the historical spectral response at the encoder 320 to determine a similarity between the reproduced spectral response and the historical spectral response. If the similarity is below an initial threshold, then the comparer 350 instructs the encoder 320, the latent space database 330, and the decoder 340 to repeat their functions, and the comparer 350 reassigns weights and biases in the encoder 320 and the decoder 340 until the similarity is at or above the initial threshold. Once the similarity is at or above the initial threshold, the comparer 350 instructs the decoder 340 to freeze, and thus become a frozen decoder. The comparer 350 stores the decoder 340 for further use in the neural network system 360 in the trainer 120 and for further use in the tester 130.

The neural network system 360 comprises a neural network 370, a decoder 380, and a comparer 390. The neural network 370 is a software component or software components comprising various functions that train to produce complex relationships between the historical spectral response and the historical measurements. The neural network 370 may be distributed among multiple hardware computers. The decoder 380 and the comparer 390 are software components. The decoder 380 is the frozen decoder described above and remains frozen in the neural network system 360. Thus, between the neural network 370 and the decoder 380, only the neural network 370 trains.

The neural network 370 receives historical measurements from the database 150, determines dominant features of the historical measurements, learns to relate the dominant features to the historical spectral response, and provides the dominant features to the decoder 380, thereby associating the historical measurements to the historical spectral response. Alternatively, the historical measurements are real-time measurements, and the neural network 370 receives the real-time measurements from a real-time source of data. If the historical spectral response is an NMR T2 distribution, then the historical measurements comprise fluid saturation data; mineral composition data; raw subsurface logs such as gamma ray logs, resistivity logs, anisotropy logs, neutron porosity logs, density porosity logs, or photoelectric factor logs; or other suitable data from a subsurface, a surface, the atmosphere, or a laboratory. If the spectral historical spectral response is a dielectric spectrum, then the historical measurements comprise natural radiation data, induced radiation data, density data, porosity data, nuclear radiation data, photoelectric factor logs, sonic data, sonic logs, resistivity data, or other suitable data from a subsurface, a surface, the atmosphere, or a laboratory. The historical measurements are for the historical material. The dominant features of the historical measurements are heights of peaks, variances around the peaks, distances between the peaks, relative features of the peaks, rates of change or other higher-order derivatives of magnitudes and phases with respect to time or other independent variables, numbers of peaks, or other identifying features of the historical measurements.

The decoder 380 begins as the frozen decoder described above. The decoder 380 decodes a trained spectral response based on a projection of the historical measurements on the dominant features in the historical measurements with respect to the historical spectral response. Because the decoder 380 projects data from a relatively lower dimension in the dominant features to a relatively higher dimension in the trained spectral response, the decoder 380 widens from left to right. Alternatively, the decoder 340 is a comparator or a reconstructor.

The comparer 390 compares the trained spectral response from the decoder 380 to the historical spectral response at the encoder 320 to determine a similarity between the trained spectral response and the historical spectral response. If the similarity is below a final threshold, then the comparer 390 instructs the neural network 370 to repeat its functions, and the comparer 390 reassigns weights and biases in the neural network 370 until the similarity is at or above the final threshold. Once the similarity is at or above the final threshold, the comparer 390 instructs the neural network 370 to freeze, and thus become a frozen neural network. The comparer 390 stores the neural network 370 for further use in the tester 130.

Figure 6:
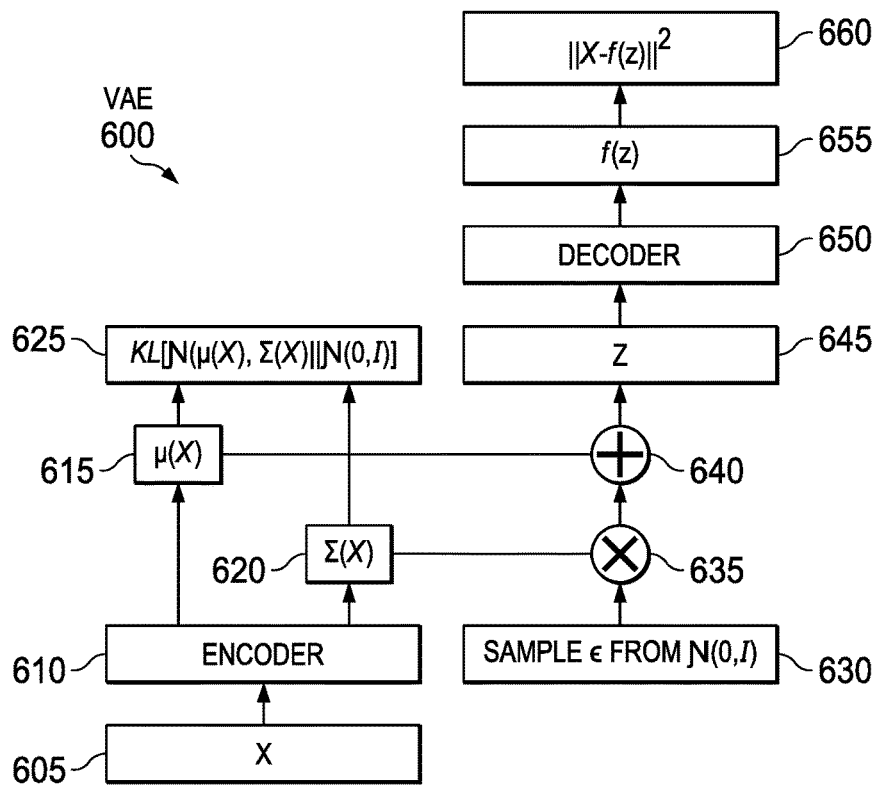
FIG. 6 is a schematic diagram of mathematical operations performed in a VAE according to an embodiment of the disclosure.

FIG. 6 is a schematic diagram of mathematical operations performed in a VAE 600 according to an embodiment of the disclosure. The VAE 600 is an embodiment of the deep neural network model 310 in FIG. 3. The VAE 600 comprises an input x 605, an encoder 610, function 615, a function 620, a loss function 625, a sample ε 630, a multiplier 635, an adder 640, a latent space z 645, a decoder 650, a function 655, and a loss function 660.

The input x 605, the encoder 610, the latent space z 645, and the decoder 650 are similar to the historical spectral response, the encoder 320, the latent space in the latent space database 330, and the decoder 340 in FIG. 3, respectively. The function 615 is an deterministic function that defines a mean of a probability distribution function of a projection generated by the encoder 610. The function 620 is an deterministic function that defines a covariance the probability distribution function. The function 655 is a deterministic function that is a reproduction of the input x 605.

The loss functions 625, 660 guide the VAE 600 to generate an output, for instance the reproduced spectral response in FIG. 3, that matches the input x 605. The VAE 600 alters weights to minimize the loss functions 625, 660. The loss function 660 enables the VAE 600 to learn to minimize a difference between inputs and outputs. A KL divergence of the loss function 625 forces the encoder 610 to generate the latent space z 645 so that the latent space z 645 follows a Gaussian distribution. As described in Carl Doersch, "Tutorial on Variational Autoencoders," Aug. 13, 2016, which is incorporated by reference, a KL divergence between two multivariate Gaussian distributions is expressed as follows:

$$KL = [N(\mu(X), \sum(x) \| N(0, I)] = \frac{1}{2}(tr(\sum(X)) + (\mu(X))^2(\mu(X)) - k - \text{logdet}(\sum(X))), \quad (2)$$

where X is a historical spectral response and $N(\mu,\Sigma)$ represents the Gaussian distribution with a mean $\mu$ a covariance $\Sigma$, and a dimensionality k.

The sample ε 630 represents a re-parameterization trick to reconstruct the latent space z 645. A neural network such as the neural network 370 in FIG. 3 trains through backpropagation and therefore calculates a contribution of each node to a final error, then learns to reduce an error. If latent variables sample randomly from the Gaussian distribution, then backpropagation may not be efficient for training the neural network. The representation process selects the sample ε 630 from the Gaussian distribution, which is N(0, I), and changes its mean and variance through a linear calculation. By this method, the latent space z 645 still follows the Gaussian distribution, but the neural network may train through backpropagation.

Figure 7:
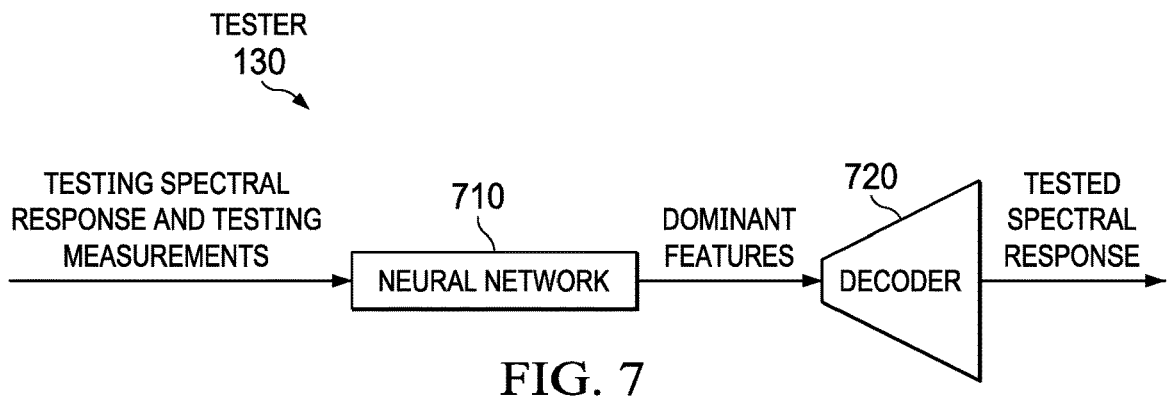
FIG. 7 is a schematic diagram of the tester in FIG. 1.

FIG. 7 is a schematic diagram of the tester 130 in FIG. 1. The tester 130 is similar to the neural network system 360 in FIG. 3. However, the tester 130 comprises a neural network 710, which is the frozen neural network after the neural network system 360 completes training, and a decoder 720, which is the frozen decoder after the deep neural network model 310 completes training. The tester 130 obtains the neural network 710 and the decoder 720 from the database 150. As mentioned above, the tester 130 performs step 220 in FIG. 2.

The neural network 710 receives a testing spectral response and testing measurements from the database 150, determines dominant features of the testing measurements that correspond to dominant features of the testing spectral response, and provides the dominant features of the testing measurements to the decoder 720. The testing spectral response and the testing measurements are the same types of spectral response and measurements as the historical spectral response and historical measurements described with respect to FIG. 3 and are therefore a spectral response and measurements of the historical material. For instance, the testing measurements may be measured at the same time as the historical measurements, but may be separated from the historical measurements randomly, arbitrarily, or based on specified criteria. Testing ensures limited or no overfitting.

The decoder 720 decodes a tested spectral response for testing based on the dominant features from the neural network 710. The decoder 720 stores the tested spectral response in the database 150 and provides the tested spectral response to the controller 110 or another component for comparison to a spectral response corresponding to the testing measurements in order to determine the accuracy of the tester 130. After the tester 130 completes testing, the tester 130 freezes the neural network 710 and the decoder 720 and stores them in the database 150 for further use in the generator 140. Alternatively, the decoder 340 is a comparator or a reconstructor.

Figure 8:
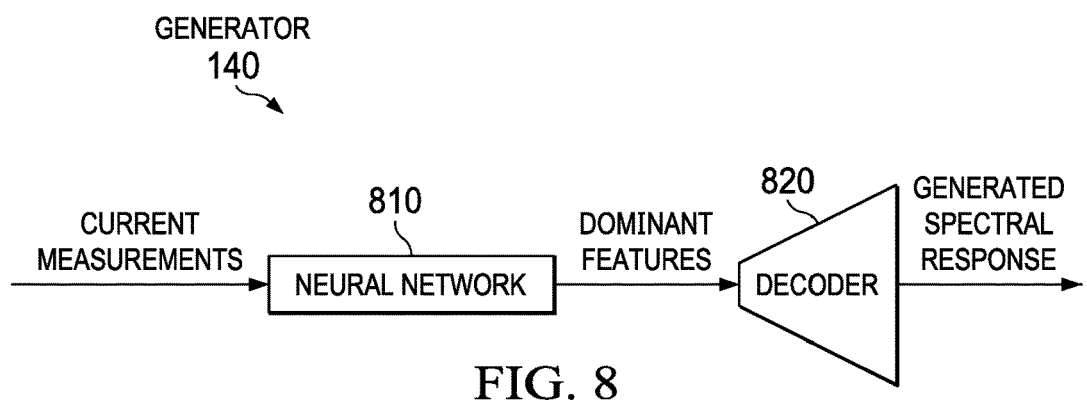
FIG. 8 is a schematic diagram of the generator in FIG. 1.

FIG. 8 is a schematic diagram of the generator 140 in FIG. 1. The generator 140 is similar to the tester 130 in FIG. 7. However, the generator 140 comprises a neural network 810, which is the frozen neural network after the neural network system 360 completes training and the tester 130 completes testing, and a decoder 820, which is the frozen decoder after the deep neural network model 310 completes training and the tester 130 completes testing. The tester 130 obtains the neural network 810 and the decoder 820 from the database 150. As mentioned above, the generator 140 performs step 230 in FIG. 2.

The neural network 810 receives current measurements from the database 150, determines dominant features of the current measurements, and provides the dominant features to the decoder 820. The current measurements are of the current material. A tool or tools perform the current measurements at a site of the current material. In this context, the word "measurement" and its derivatives indicate an actual measurement of a material by a device contacting or otherwise directly observing the material, while the word "generated" and its derivatives indicate a calculation of a spectral response of a material by a device not contacting or otherwise directly observing the material, but remote from and independent of the material. The current measurements are of a fluid saturation, a gas saturation, a kerogen content, or a mineral composition. The fluid may be water or oil.

The decoder 820 decodes a generated spectral response based on the dominant features from the neural network 810. The decoder 820 stores the generated spectral response in the database 150. The neural network 810 and the decoder 820 need not perform their functions at the site of the current material, but may do so in a laboratory, a subsurface, or another location remote from the current material. Alternatively, the decoder 340 is a comparator or a reconstructor.

Though the components of the system 100 are described as being hardware components or software components, any suitable combination of hardware or software may implement the components. In addition, the components may exist on a single device, on multiple devices, or as distributed sensing and computing units. Furthermore, though the neural network system 360, the tester 130, and the generator 140 are described as three separate systems, they may be the same system, but at different stages such as training, testing, and simulating. Finally, though generated spectral responses that are NMR T2 distributions and dielectric spectral responses are described, the system 100 may generate other generated spectral responses relevant to industries that perform spectroscopy-based material analyses such as oil and gas, mining, material characterization, metallurgy, chemical, analytical chemistry, drug development, medical sensing, medical diagnostics, geophysical, remote sensing, semiconductor, construction, civil engineering, and other industries.

Figure 9:
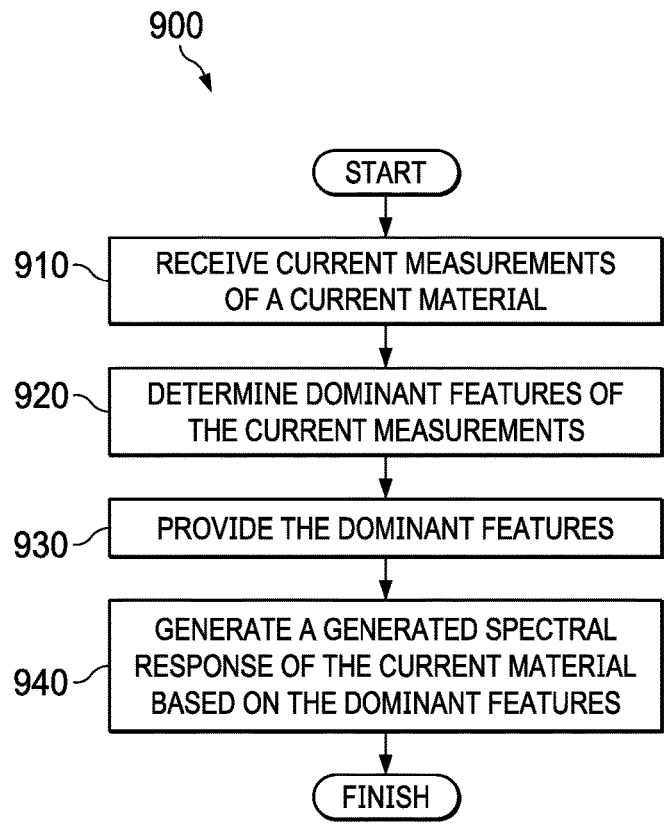
FIG. 9 is a flowchart illustrating a method of generating a generated spectral response of a material according to another embodiment of the disclosure.

FIG. 9 is a flowchart illustrating a method 900 of generating a generated spectral response of a material according to another embodiment of the disclosure. The generator 140 may implement the method 900. At step 910, current measurements of a current material are received. For instance, the neural network 810 receives the current measurements. At step 920, dominant features of the current measurements are determined. For instance, the neural network 810 determines the dominant features. At step 930, the dominant features are provided. For instance, the neural network 810 provides the dominant features to the decoder 820. Finally, at step 940, a generated spectral response of the current material is generated based on the dominant features. For instance, the decoder 820 generates the generated spectral response. Based on the generated spectral response, one may determine what kind of material the current material is, how porous the current material is, how big the pores are, a pore size distribution, a depth below the surface wherein the current material exhibits desired properties, whether water or oil is in the current material, how much water or oil is in the current material, a permeability, a fluid mobility, a bound fluid saturation, an internal structure, a composition, a concentration, a spatial variation, a temporal change, or another characteristic of the current material. Based on that, one may determine whether to perform an operation of a material area containing the current material and, if so, at what depth. The operation may be a drilling operation or a well completion operation. The method 900 may implement other steps such as comparing the dominant features of the current measurements with dominant features of historical measurements and relating the dominant features of the current measurements to spectral responses in the database 150.

Figure 10:
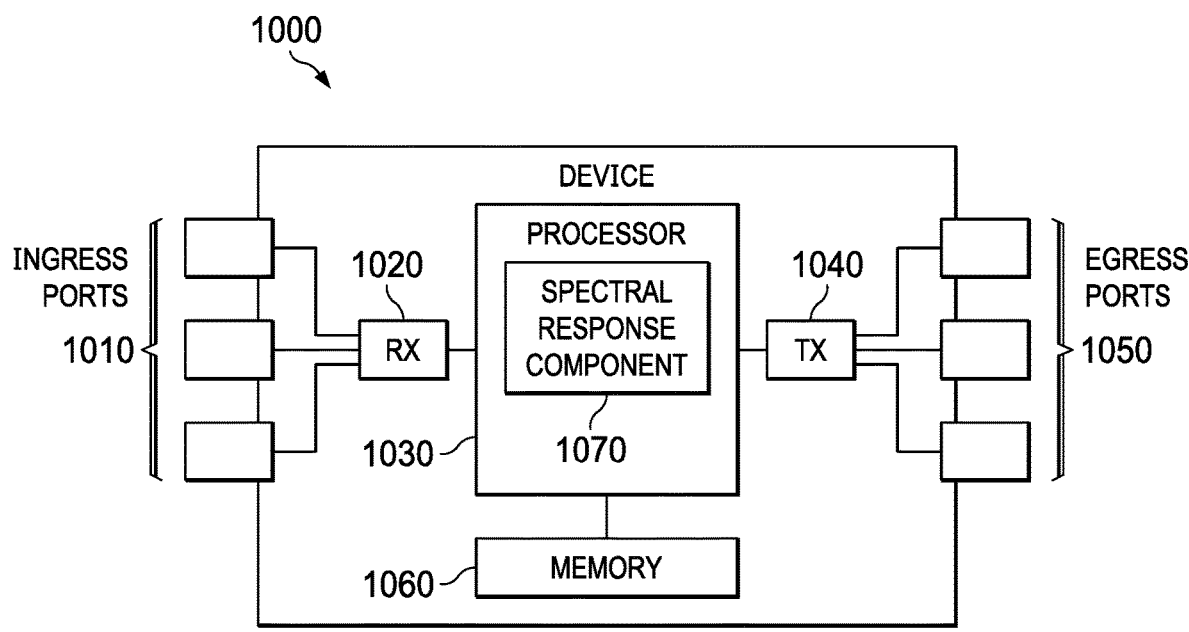
FIG. 10 is a schematic diagram of a device according to an embodiment of the disclosure.

FIG. 10 is a schematic diagram of a device 1000 according to an embodiment of the disclosure. The device 1000 may implement the disclosed embodiments. For instance, the device 1000 implements the controller 110, the trainer 120, the tester 130, the generator 140, or the database 150. The device 1000 comprises ingress ports 1010 and an RX 1020 that receive data; a processor, logic unit, or CPU 1030 that processes the data; a TX 1040 and egress ports 1050 that transmit the data; and a memory 1060 that stores the data. The device 1000 may also comprise OE components and EO components coupled to the ingress ports 1010, the RX 1020, the TX 1040, and the egress ports 1050 for ingress or egress of optical or electrical signals.

The processor 1030 is any suitable combination of hardware, middleware, firmware, or software. The processor 1030 comprises any combination of one or more CPU chips, cores, FPGAs, ASICs, or DSPs. The processor 1030 communicates with the ingress ports 1010, RX 1020, TX 1040, egress ports 1050, and memory 1060. The processor 1030 comprises a spectral response component 1070, which implements the disclosed embodiments. The inclusion of the spectral response component 1070 therefore provides a substantial improvement to the functionality of the device 1000 and effects a transformation of the device 1000 to a different state. Alternatively, the memory 1060 stores the spectral response component 1070 as instructions, and the processor 1030 executes those instructions.

The memory 1060 comprises one or more disks, tape drives, or solid-state drives. The device 1000 may use the memory 1060 as an over-flow data storage device to store programs when the device 1000 selects those programs for execution and to store instructions and data that the device 1000 reads during execution of those programs. The memory 1060 may be volatile or non-volatile and may be any combination of ROM, RAM, TCAM, or SRAM.

Example Training and Testing

The system 100 analyzed data from two formations in Bakken Formation shale. Specifically, the trainer 120 trained with the data and the tester 130 tested the data. Variations in mineral compositions changed pore structures, grain textures, and surface reflexivity of the formations. Those characteristics, as well as fluid saturations and pore network distribution, affected an NMR T2 distribution of the formations.

The data were randomly split into training data and testing data. The training data comprised historical spectral responses and historical measurements from 460 depths of the formations. The testing data comprised testing measurements from 100 depths of the formations. The historical spectral responses comprised 64 dimensions, and the encoder 320 created both a 2D latent space and a 3D latent space.

Figure 11:
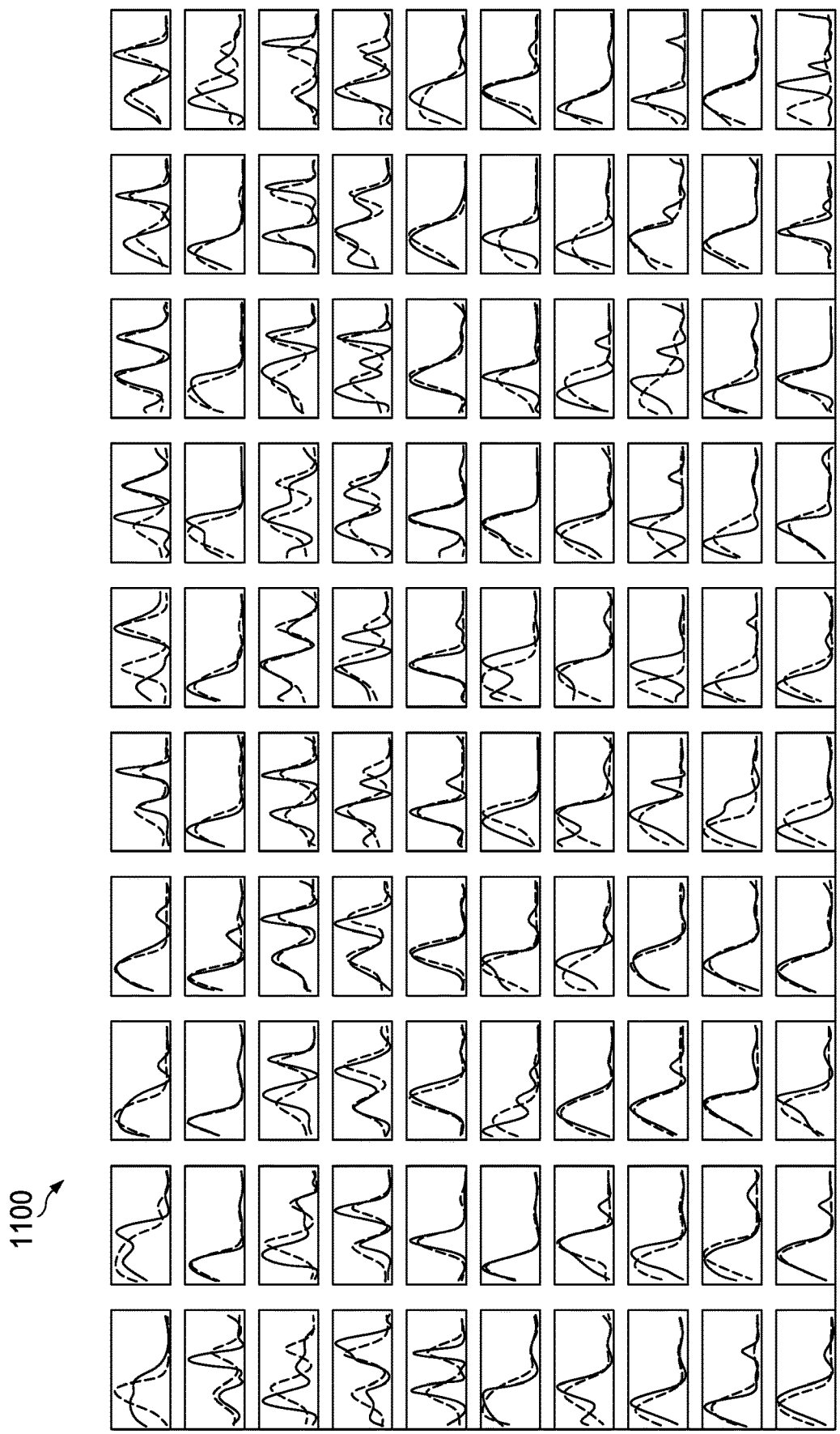
FIG. 11 is a plot comparing historical spectral responses to tested spectral responses for the 2D latent space.
Figure 12:
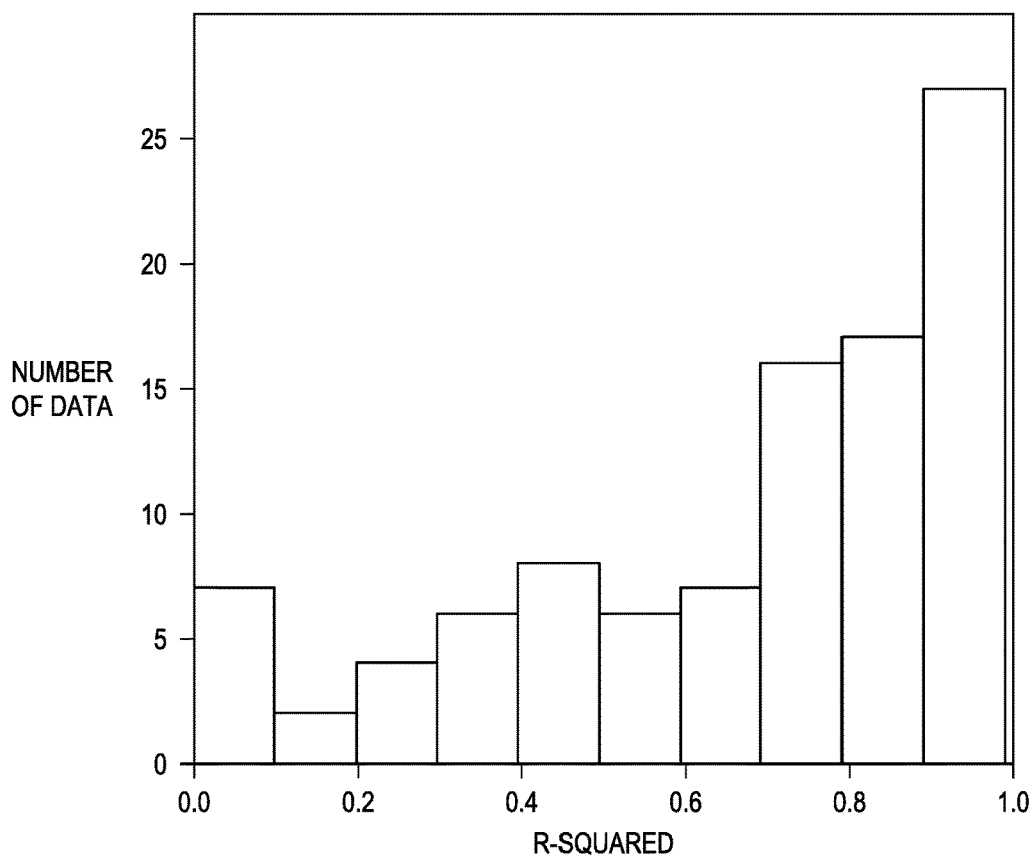
FIG. 12 is a plot of R-squared for the generated spectral responses for the 2D latent space.

For the 2D latent space, 100 randomly-selected samples are shown as the 2D latent space 400 in FIG. 4. FIG. 11 is a plot 1100 comparing historical spectral responses to tested spectral responses for the 2D latent space. As shown, the historical spectral responses and the tested spectral responses are similar. FIG. 12 is a plot 1200 of R-squared for the generated spectral responses for the 2D latent space. As shown, as a number of data increased, the R-squared increased. For historical spectral responses with one peak, the R-squared was 0.8, and a normalized RMS deviation was 14%. For historical spectral responses with two peaks, accuracy decreased. However, less than one-third of the historical spectral responses were associated with two peaks. An average R-squared was 0.75, and an average normalized RMS deviation was 15%.

Figure 14:
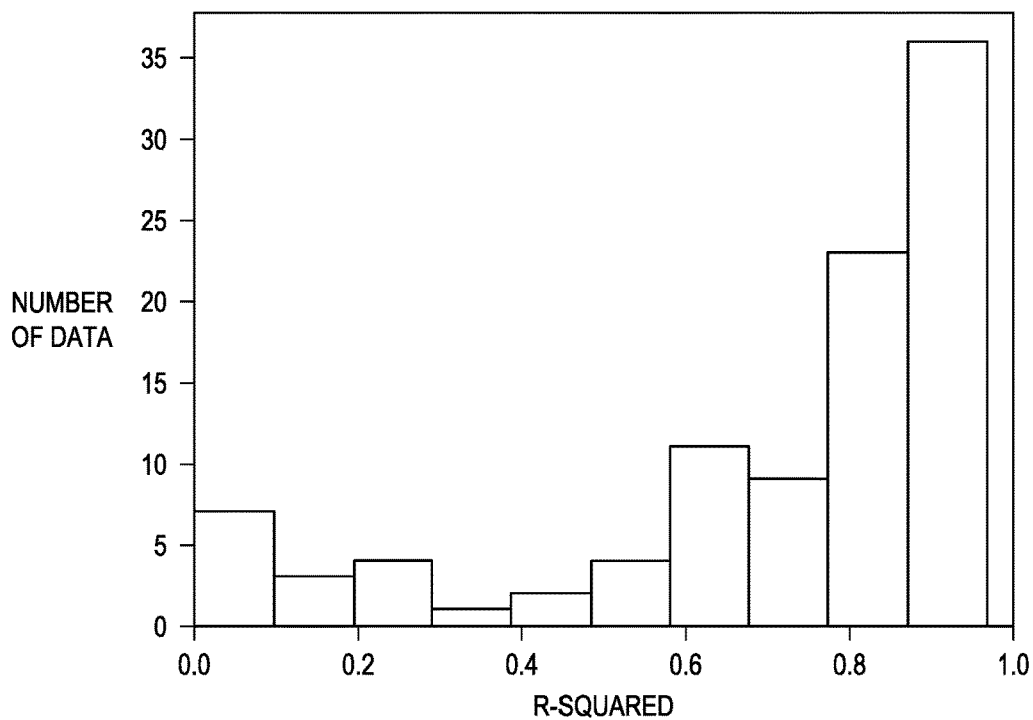
FIG. 14 is a plot of R-squared for the generated spectral responses for the 3D latent space.
Figure 13:
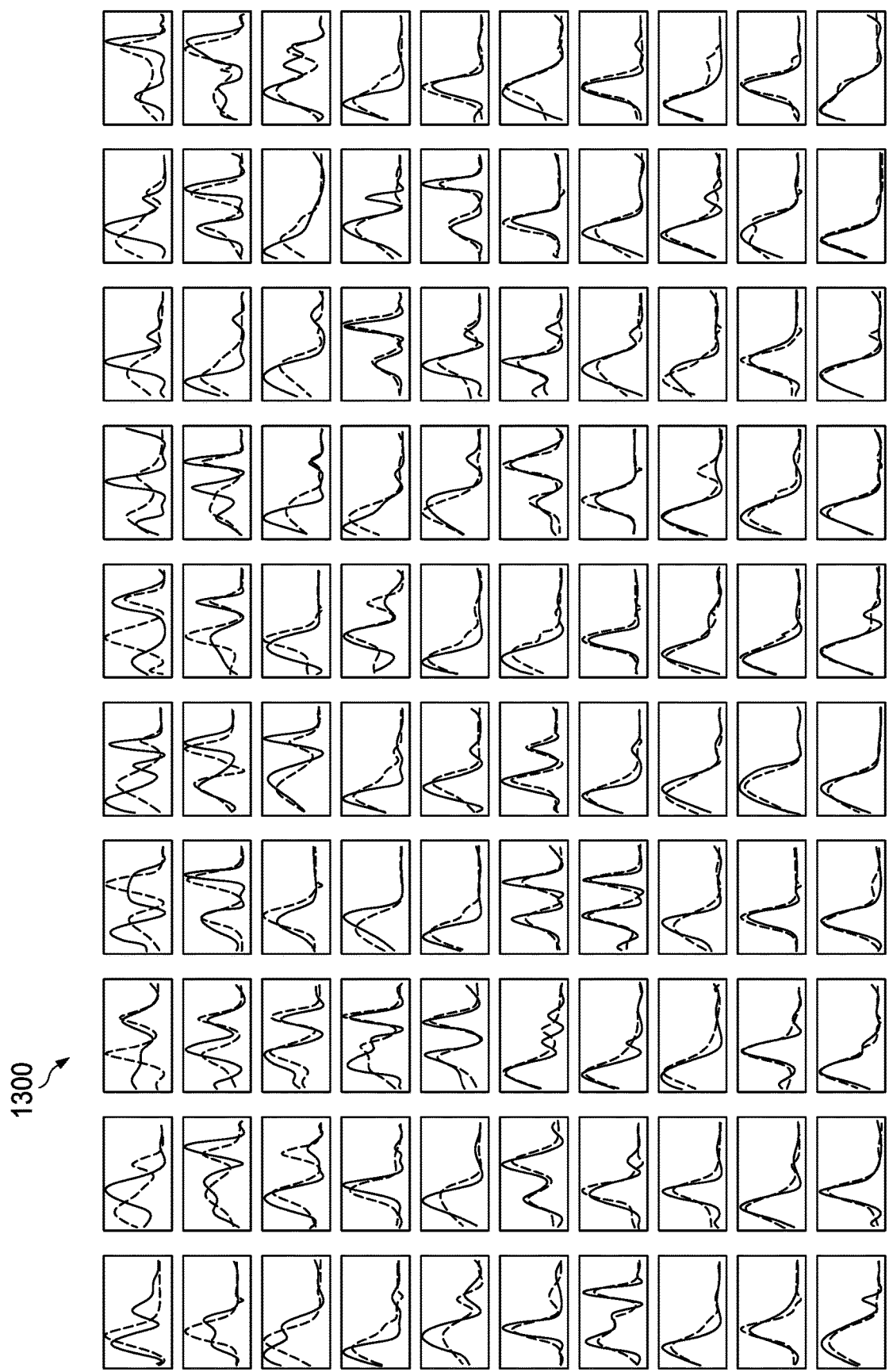
FIG. 13 is a plot comparing historical spectral responses to tested spectral responses for the 3D latent space.

For the 3D latent space, the historical spectral responses and the trained spectral responses were more similar. FIG. 13 is a plot 1300 comparing historical spectral responses to tested spectral responses for the 3D latent space. FIG. 14 is a plot 1400 of R-squared for the generated spectral responses for the 3D latent space. As shown, as a number of data increased, the R-squared increased. An average R-squared was 0.77, which was better than for the 2D latent space, and an average normalized RMS deviation was 15%. However, the encoder 320 learned unrepresentative features when implementing the 3D latent space. For instance, the distributions in the lower-left corner of the graph 1300 exhibit second peaks, which are small, but unnatural features.

Figure 15:
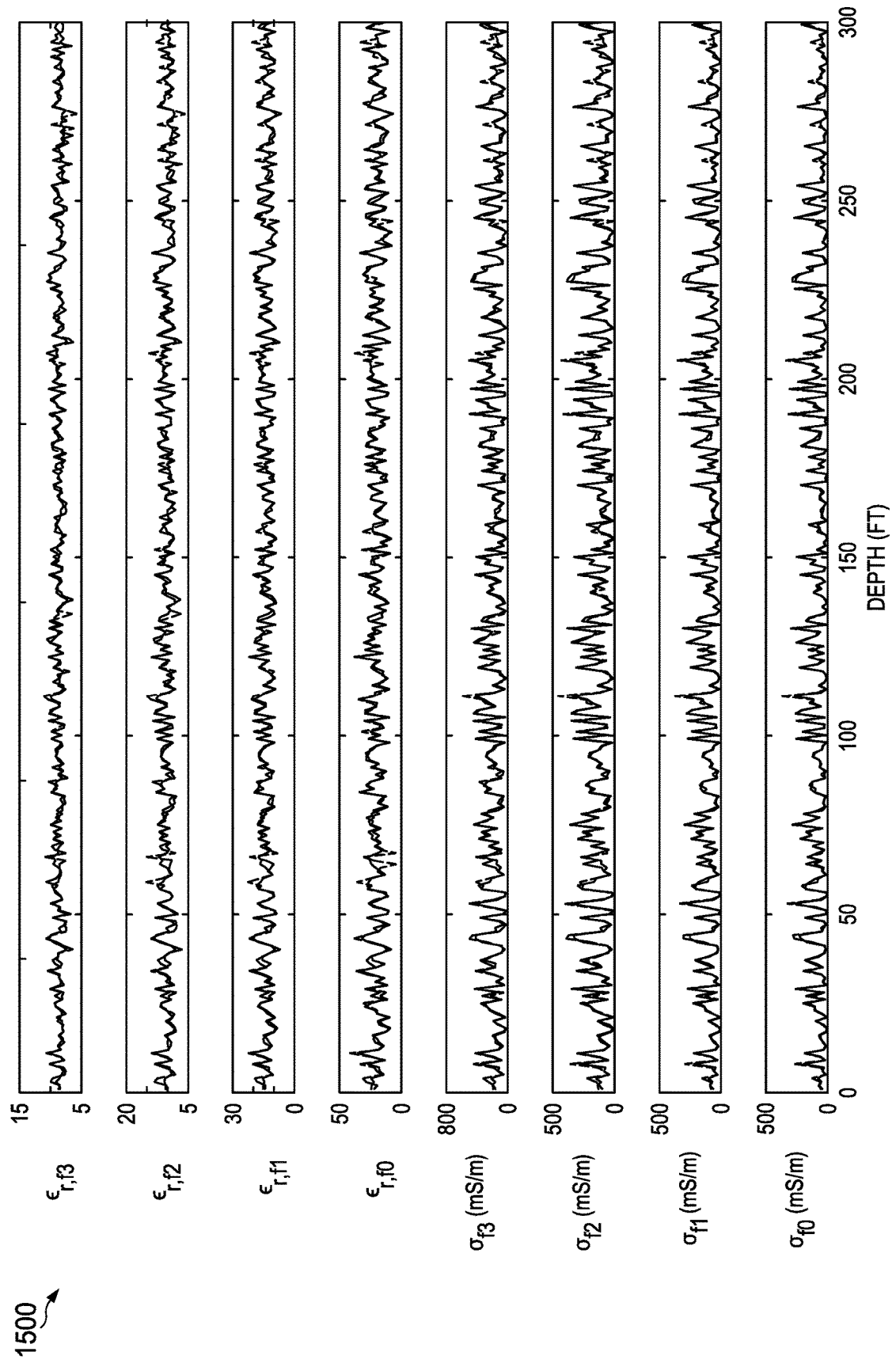
FIG. 15 is a series of plots comparing original dielectric spectra to generated dielectric spectra.

FIG. 15 is a series of plots 1500 comparing original dielectric spectra to generated dielectric spectra. The original dielectric spectra are shown with dashed lines, and the generated dielectric spectra are shown with solid lines. The dielectric spectra comprise both conductivity denoted as σ and relative permittivity denoted as $\epsilon_r$. The x-axes represent depth in ft, and the y-axes represent either conductivity in mS/m or relative permittivity without units. Both the conductivity and the relative permittivity are functions of operating frequency. The conductivity increases with an increase in operating frequency, and the relative permittivity decreases with an increase in operating frequency. The series of graphs 1500 comprises graphs of the conductivity and the relative permittivity acquired at operating frequencies f0, f1, f2, and f3 of a subsurface formation along a 300 ft depth interval of an oil well drilled through a hydrocarbon-bearing shale formation, wherein 20 MHz<f0<f1<f2<f3≅1 GHz. In the training phase, 3,434 depth points in the oil well were used to generate dielectric spectra using non-dielectric-spectra measurements such as gamma ray, density porosity, neutron porosity, formation photoelectric factor, bulk density, volume of clay, delta-T compressional sonic, delta-T shear sonic, and laterolog resistivity logs at various depths. In the testing phase, 300 depth points were used. Table 1 shows the accuracy of the tester 130 in generating dielectric spectra at f0, f1, f2, and f3 for the 300 depth points.

TABLE 1

Tester Accuracy

| | $R^2$ | | | |
|---|---|---|---|---|
| | f0 | f1 | f2 | f3 |
| Conductivity | 0.93 | 0.92 | 0.90 | 0.86 |
| Permittivity | 0.70 | 0.71 | 0.65 | 0.62 |

Figure 16:
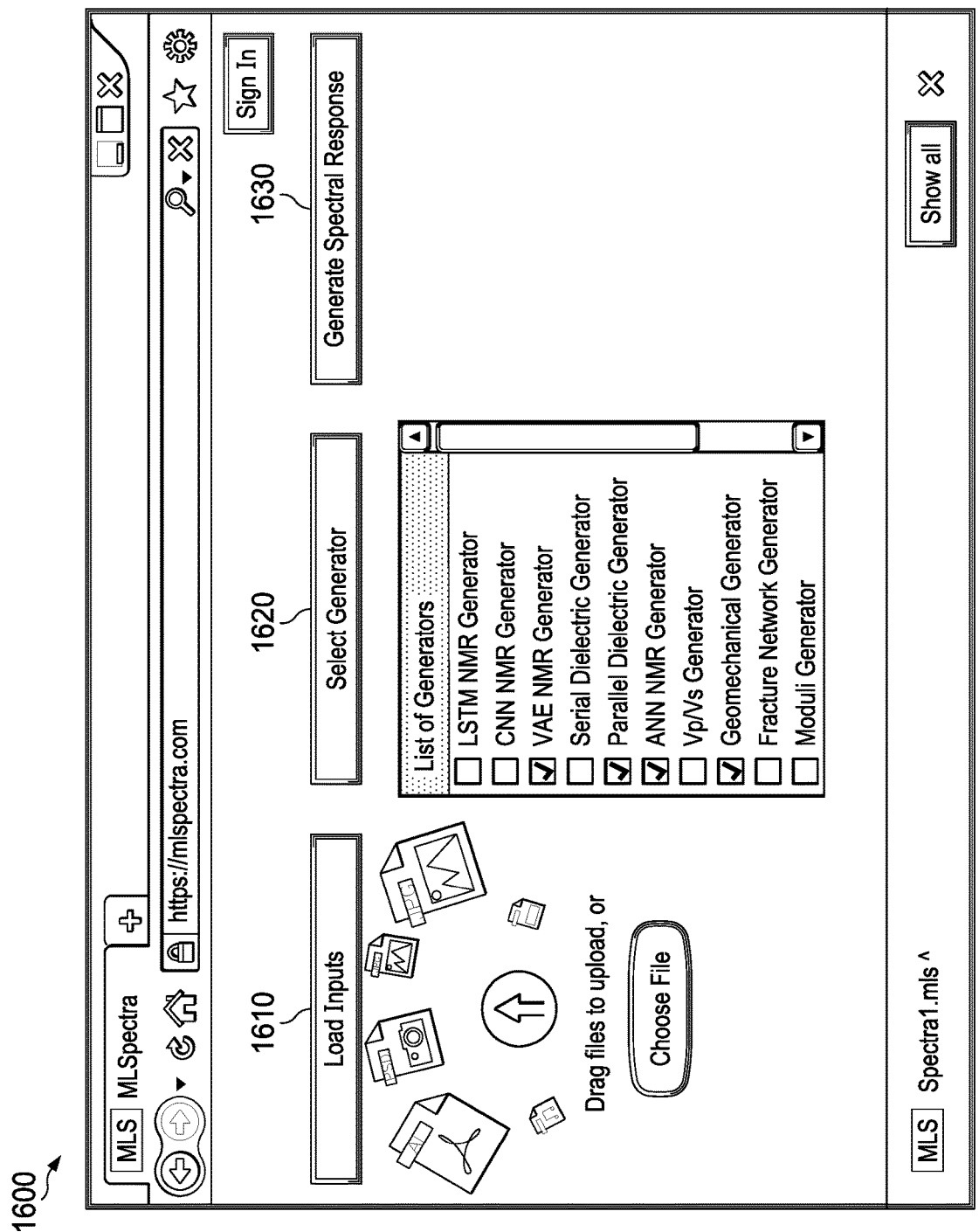
FIG. 16 is a GUI for implementing the system in FIG. 1 according to an embodiment of the disclosure.

FIG. 16 is a GUI 1600 for implementing the system 100 in FIG. 1 according to an embodiment of the disclosure. Specifically, the GUI 1600 may implement the GUI described with respect to the controller 110 in FIG. 1. The GUI 1600 comprises a load inputs button 1610, a selector generator button 1620, and a generate spectral response button 1630. A user clicks or otherwise selects the load inputs button 1610 to upload inputs like the current measurements in FIG. 8; clicks or otherwise selects the select generator button 1620 to select a type of the trainer 120, the tester 130, and the generator 140 in FIGS. 1, 3 and 7-8; and clicks or otherwise selects the generate spectral response button 1630 to obtain the generated spectral response in FIG. 8. The generated spectral response may be available in a subsequent GUI. The GUI 1600 and the generator 140 may communicate via the cloud.

Figure 17:
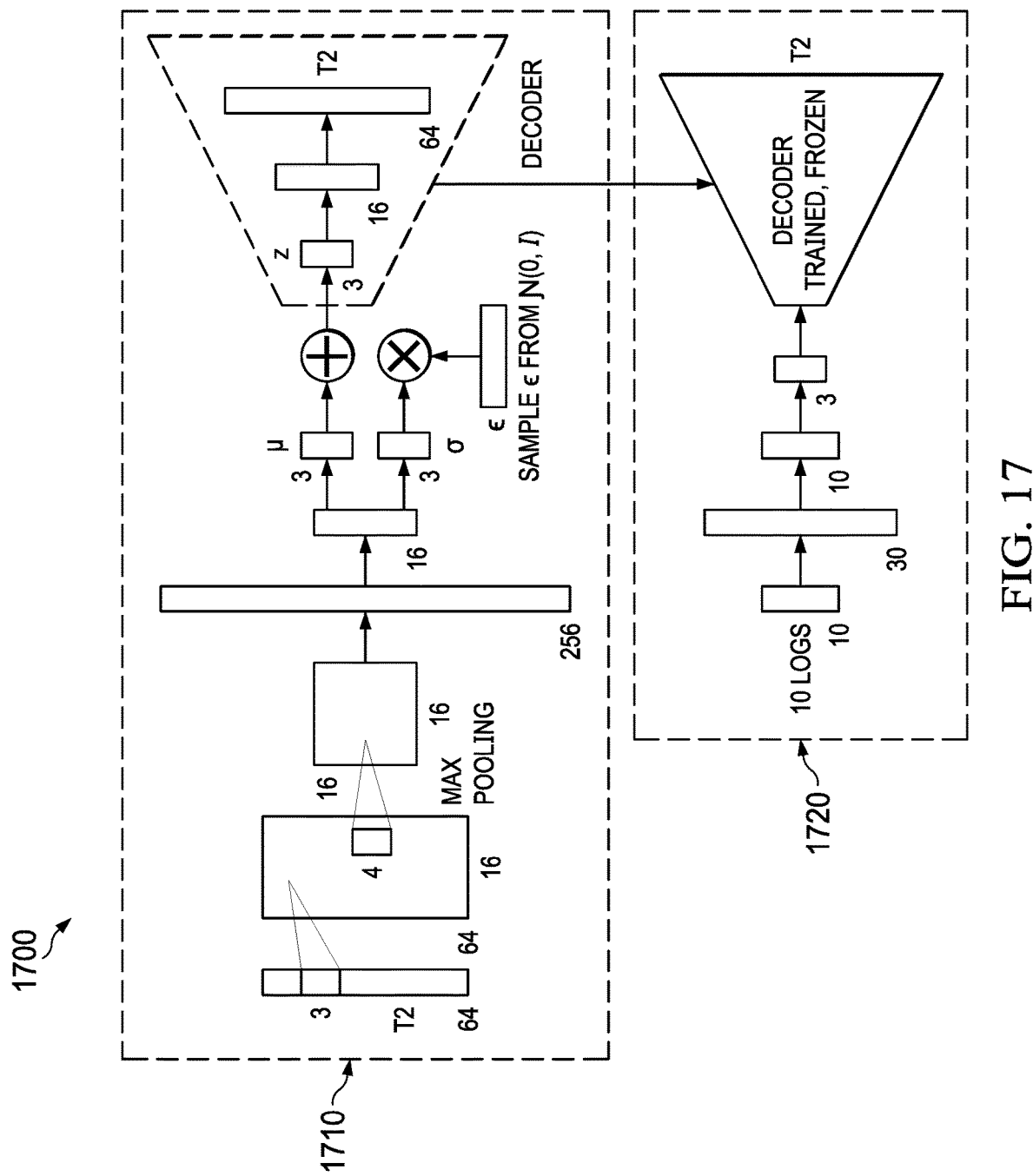
FIG. 17 is a schematic diagram of a generator based on a VAE-CNN model according to an embodiment of the disclosure.

FIG. 17 is a schematic diagram of a generator 1700 based on a VAE-CNN model according to an embodiment of the disclosure. The generator 1700 implements a VAE-CNN model. The generator 1700 comprises a first stage 1710 that performs VAE with a convolution layer and a second stage 1720 that is a VAE-based neural network. A VAE implements the CNN. The VAE is a neural network with a bottleneck architecture that compresses high-dimensional data into a low-dimensional space. The VAE comprises an intermediate layer with two or three neurons. The VAE is designed to reproduce its input data. The VAE moves a dataflow through a bottleneck following a Gaussian distribution in the intermediate layer. A VAEc combines the VAE and a CNN. The VAEc trains using a two-stage procedure. A normal NMR T2 distribution has a smooth multi-Gaussian shape. In the first stage 1710, the VAEc trains to learn how to generate a typical NMR T2 from the training dataset. The VAEc processes NMR T2 data as a 1D datatype. A convolutional layer has 16 filters to transform the NMR T2 and extract generalized features. An encoder constructs a 3D latent layer after compressing the input T2 into the latent space, while preserving the relationship in a higher-dimensional space. A decoder generates a typical NMR T2 from the 3D latent space. In the second stage 1720, the trained decoder is an NMR T2 generator and trains with a small neural network that processes a formation mineral composition and fluid saturation measurements.

Figure 18:
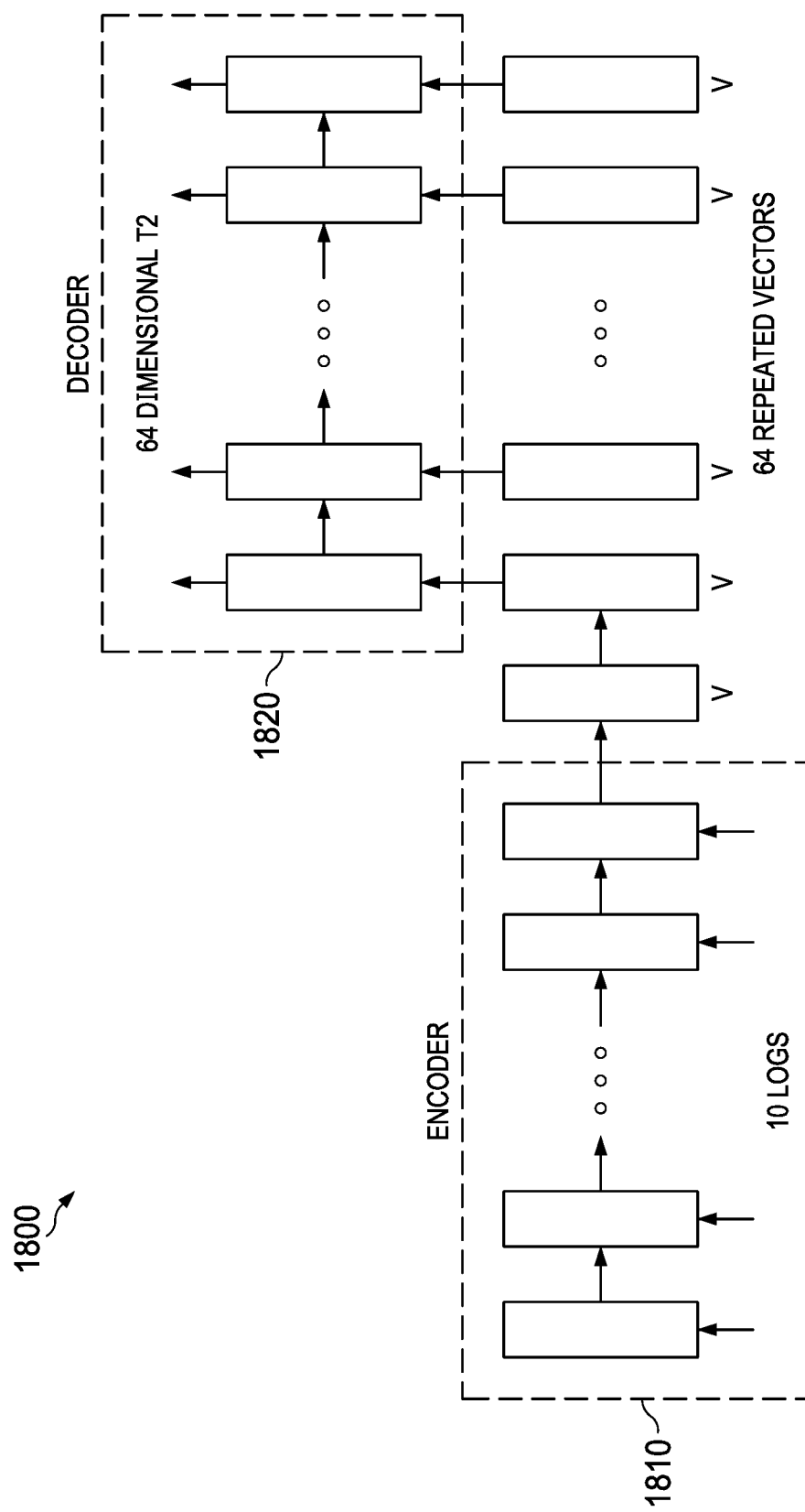
FIG. 18 is a schematic diagram of a generator based on an LSTM/RNN model according to an embodiment of the disclosure.

FIG. 18 is a schematic diagram of a generator 1800 based on an LSTM-RNN model according to an embodiment of the disclosure. The generator 1800 implements an LSTM-RNN model. The generator 1800 comprises an encoder 1810 and a decoder 1820. An LSTM is a recurrent neural network designed to handle long and short-term data dependencies such as those in language and stock market prediction. The LSTM uses a repeated data processing module to process data at each step. The LSTM memorizes the data by internal state and keeps a data flow in the repeated data processing module by gates, which are composed of sigmoid activation functions. The LSTM treats formation mineral content and fluid saturation measurements and a 64-dimensional NMR T2 as sequences. The LSTM mimics a language translation model, where an encoder uses input language to calculate an intermediate vector. A decoder decodes the intermediate vector into another language. The repeated data processing module solves a long-term data dependency in sequence-to-sequence mapping problems. The LSTM trained in one step as shown in FIG. 17. The encoder encodes formation composition logs into a 15-length intermediate vector v. The decoder decodes the vector v into the 64-dimensional NMR T2.

Figure 19:
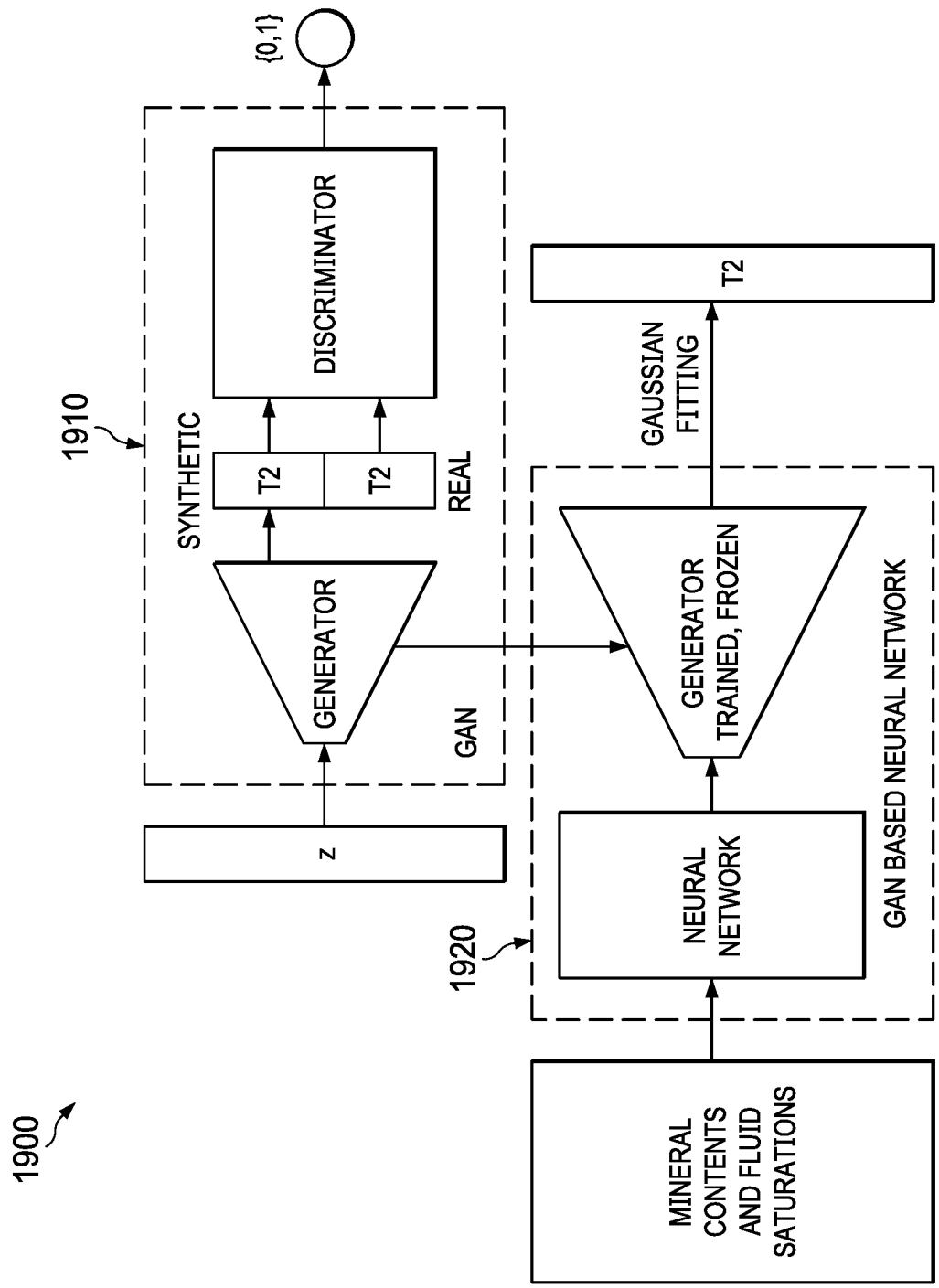
FIG. 19 is a schematic diagram of a generator based on a GAN model according to an embodiment of the disclosure.

FIG. 19 is a schematic diagram of a generator 1900 based on a GAN model according to an embodiment of the disclosure. The generator 1900 implements a GAN model. The generator 1900 comprises a first stage 1910 and a second stage 1920. The training process of the generator 1900 is similar to the training process of the generator 1700. In the first stage 1910, a GAN learns features in T2 distributions. A generator and a discriminator train alternatively until the generator can generate an NMR T2 that cannot be identified by the discriminator as generated data. After the GAN trains, a frozen generator connects to a neural network like in FIG. 3 to learn to associate different mineral contents and fluid saturations measurements with learned features of T2 distributions. After the training, NMR T2 distributions are generated in a testing phase like in FIG. 3. T2 distributions generated by a GAN are not smooth. Therefore, a Gaussian fitting process fits a generated NMR T2 to make it smoother and more realistic. The generator is a 3-layer neural network that receives a six-dimensional noise vector as an input. The generator learns to generate the NMR T2 with different shapes with the aid of the discriminator. An output uses 64 dimensions to generate the T2 distribution. The discriminator contains 4 layers with 2 hidden layers that have 64 and 16 neurons each. 4,608 and 5,234 parameters train in the generator and discriminator, respectively. After the first stage 1910, a third neural network comprises 4 layers having 2 hidden layers with 30 neurons each. A third neural network has 10-dimensional inputs and 6-dimensional outputs. The third NN trains with the frozen generator from the generator 1900 in a manner similar to the training in FIG. 3.

Figure 20:
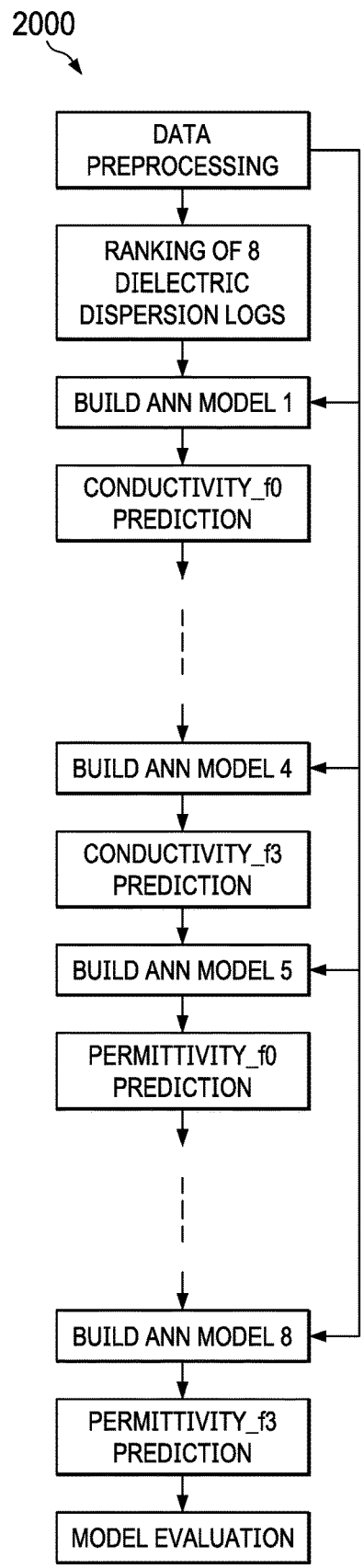
FIG. 20 is a flowchart illustrating a method of using a stacked ANN model for generating dielectric spectra according to an embodiment of the disclosure.

FIG. 20 is a flowchart illustrating a method 2000 of using a stacked ANN model for generating dielectric spectra according to an embodiment of the disclosure. The method 2000 may generate dielectric spectra, including conductivity spectra and relative permittivity spectra. 4 conductivity and 4 permittivity spectra measurements are ranked using a k-fold cross validation method. Ranking is done in order of the accuracy of their predictions using an ANN model. After ranking 8 DD logs, another ANN model sequentially generates 8 dispersion spectra one at a time, starting with predicting a spectrum having a highest prediction accuracy and ending with predicting a spectrum having a lowest prediction accuracy. During generation of each subsequent dispersion log, the ANN specific to that log is fed with previously predicted logs and the 15 current measurements of current material for which the dielectric spectra is desired to be generated. Physics of charge polarization gives rise to a dependence between conductivity and permittivity at each frequency and to a dependence of conductivity and permittivity dispersions on frequencies. The method 2000 mimics these physical trends. The 8 dielectric dispersion spectra are ranked in terms of prediction accuracy achieved when performing simultaneous generation using a single neural network, then sequential predictions of the 8 dielectric spectra are performed based on a predetermined rank, thereby honoring the dependence of conductivity and permittivity dispersions on frequencies.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, components, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A controller comprising:
a memory; and
a processor coupled to the memory and configured to:
cause a neural network to receive current measurements of a current material, wherein the current measurements are non-spectral measurements, and wherein the current material is a hydrocarbon-bearing geological rock in a laboratory or a subsurface;
instruct the neural network to determine dominant features of the current measurements;
instruct the neural network to provide the dominant features to a decoder; and
instruct the decoder to generate a generated spectral response of the current material based on the dominant features.

2. The controller of claim 1, wherein the generated spectral response is independent of a measured spectral response.

3. The controller of claim 1, wherein the processor is further configured to further instruct the decoder to generate the generated spectral response independent of inputs other than the dominant features.

4. The controller of claim 1, wherein the controller is further configured to instruct, before causing the neural network to receive the current measurements, a trainer to perform training using a historical spectral response of a historical material and using historical measurements of the historical material.

5. The controller of claim 4, wherein the controller is further configured to instruct, after the training but before causing the neural network to receive the current measurements, a tester to perform testing using testing measurements and testing spectral responses of the historical material.

6. The controller of claim 1, wherein the generated spectral response is a nuclear magnetic resonance (NMR) T2 distribution.

7. The controller of claim 6, wherein the current measurements are of fluid saturation, a gas saturation, a kerogen content, or a mineral composition.

8. The controller of claim 6, wherein the current measurements are of a gamma ray count, a sonic impedance, or a well-log response.

9. The controller of claim 1, wherein the generated spectral response is a dielectric spectrum.

10. The controller of claim 9, wherein the current measurements are of natural radiation, density, porosity, nuclear radiation, resistivity, sonic activity, or a combination thereof.

11. The controller of claim 1, wherein the generated spectral response is a synthetic spectral response.

12. The controller of claim 1, wherein the current measurements are of fluid saturation, a gas saturation, a kerogen content, or a mineral composition.

13. The controller of claim 1, wherein the neural network implements a pattern-recognition code.

14. The controller of claim 1, wherein the decoder implements a neural network or a pattern-recognition code.

15. The controller of claim 1, wherein the generated spectral response is a nuclear magnetic resonance (NMR) T1 distribution, a dielectric dispersion spectrum, or a conductivity spectrum.

16. The controller of claim 1, wherein the current measurements and the generated spectral response are acquired in the laboratory or the subsurface.

17. A method comprising:
receiving current measurements of a current material, wherein the current measurements are non-spectral measurements, and wherein the current material is a hydrocarbon-bearing geological rock in a laboratory or a subsurface;
determining dominant features of the current measurements;
providing the dominant features; and
generating a generated spectral response of the current material based on the dominant features.

18. The method of claim 17, further comprising further generating the generated spectral response independent of inputs other than the dominant features, wherein the generated spectral response is independent of a measured spectral response.

19. The method of claim 17, further comprising performing, before receiving the current measurements, training using a historical spectral response of a historical material and using historical measurements of the historical material.

20. The method of claim 18, further comprising performing, after training but before receiving the current measurements, testing using testing measurements of the historical material.

21. The method of claim 17, wherein the generated spectral response is a nuclear magnetic resonance (NMR) T2 distribution, and wherein the current measurements are of fluid saturations, mineral compositions, or both fluid saturation and mineral composition.

22. The method of claim 17, wherein the generated spectral response is a dielectric spectrum, and wherein the current measurements are of natural radiation, density, porosity, nuclear radiation, resistivity, sonic activity, or a combination thereof.

23. The method of claim 17, further comprising determining characteristics of the current material based on the generated spectral response.

24. The method of claim 17, further comprising determining whether to perform an operation of a material area based on the characteristics, wherein the material area is a source of the current material.

25. The method of claim 24, wherein the operation is a drilling operation.

26. The method of claim 24, wherein the operation is a well completion operation.

27. The method of claim 24, wherein the operation is a stimulation operation or a production operation.

28. The method of claim 17, wherein the current measurements are of fluid saturation, a gas saturation, a kerogen content, or a mineral composition.

29. The method of claim 17, wherein the generated spectral response is a synthetic spectral response.

30. A computer program product comprising instructions for storage on a non-transitory medium and that, when executed by a processor, cause an apparatus to:
cause a neural network to receive current measurements of a current material, wherein the current measurements are non-spectral measurements, and wherein the current material is a hydrocarbon-bearing geological rock in a laboratory or a subsurface;
instruct the neural network to determine dominant features of the current measurements;
instruct the neural network to provide the dominant features to a decoder; and
instruct the decoder to generate a generated spectral response of the current material based on the dominant features.

31. The computer program product of claim 28, wherein the generated spectral response is a nuclear magnetic resonance (NMR) T2 distribution.

32. The computer program product of claim 31, wherein the current measurements are of fluid saturation, a gas saturation, a kerogen content, or a mineral composition.

* * * * *